(12) United States Patent
Hamamoto et al.

(10) Patent No.: US 9,581,895 B2
(45) Date of Patent: Feb. 28, 2017

(54) MASK BLANK SUBSTRATE, SUBSTRATE WITH MULTILAYER REFLECTIVE FILM, REFLECTIVE MASK BLANK, REFLECTIVE MASK, METHOD OF MANUFACTURING MASK BLANK SUBSTRATE, METHOD OF MANUFACTURING SUBSTRATE WITH REFLECTIVE FILM AND METHOD OF MANUFACTURING SEMICONDUCTOR DEVICE

(71) Applicant: HOYA CORPORATION, Tokyo (JP)

(72) Inventors: Kazuhiro Hamamoto, Tokyo (JP); Toshihiko Orihara, Tokyo (JP); Tsutomu Shoki, Tokyo (JP); Junichi Horikawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 59 days.

(21) Appl. No.: 14/655,190

(22) PCT Filed: Dec. 27, 2013

(86) PCT No.: PCT/JP2013/085049
§ 371 (c)(1),
(2) Date: Jun. 24, 2015

(87) PCT Pub. No.: WO2014/104276
PCT Pub. Date: Jul. 3, 2014

(65) Prior Publication Data
US 2015/0331312 A1    Nov. 19, 2015

(30) Foreign Application Priority Data
Dec. 28, 2012  (JP) ................................ 2012-287376

(51) Int. Cl.
*G03F 1/50* (2012.01)
*G03F 1/60* (2012.01)
(Continued)

(52) U.S. Cl.
CPC .................. *G03F 1/60* (2013.01); *G03F 1/24* (2013.01); *G03F 1/80* (2013.01); *G03F 7/20* (2013.01)

(58) Field of Classification Search
None
See application file for complete search history.

(56) References Cited

U.S. PATENT DOCUMENTS

| 6,931,097 B1 | 8/2005 | Davis, Jr. et al. |
| 7,803,280 B2 | 9/2010 | Otsuka et al. |
| | (Continued) | |

FOREIGN PATENT DOCUMENTS

| JP | 2003-505876 A | 2/2003 |
| JP | 2006-035413 A | 2/2006 |
| | (Continued) | |

OTHER PUBLICATIONS

International Search Report of PCT/JP2013/085049 dated Apr. 1, 2014 [PCT/ISA/210].

*Primary Examiner* — Stephen Rosasco
(74) *Attorney, Agent, or Firm* — Sughrue Mion, PLLC

(57) ABSTRACT

An object of the present invention is to provide a mask blank substrate and the like that enables critical defects to be reliably detected as a result of reducing the number of detected defects, including pseudo defects, even when using highly sensitive defect inspection apparatuses that use light of various wavelengths. The present invention relates to a mask blank substrate that is used in lithography, wherein the power spectral density at a spatial frequency of $1 \times 10^{-2}$ $\mu m^{-1}$ to 1 $\mu m^{-1}$, obtained by measuring a 0.14 mm$\times$0.1 mm region on a main surface of the mask blank substrate on the side of which a transfer pattern is formed at 640$\times$480 pixels with a white-light interferometer, is not more than $4 \times 10^6$ nm$^4$, and the power spectral density at a spatial frequency of not less (Continued)

than 1 μm$^{-1}$, obtained by measuring a 1 μm×1 μm region on the main surface with an atomic force microscope, is not more than 10 nm$^4$.

26 Claims, 4 Drawing Sheets

(51) Int. Cl.
  *G03F 1/80* (2012.01)
  *G03F 7/20* (2006.01)
  *G03F 1/24* (2012.01)

(56) References Cited

U.S. PATENT DOCUMENTS

| | | | |
|---|---|---|---|
| 8,460,843 | B2 | 6/2013 | Otsuka et al. |
| 2006/0132749 | A1* | 6/2006 | Bruls ............... G03F 7/70433 355/69 |
| 2009/0095712 | A1 | 4/2009 | Yamauchi et al. |

FOREIGN PATENT DOCUMENTS

| | | |
|---|---|---|
| JP | 2006-226733 A | 8/2006 |
| JP | 2006-278515 A | 10/2006 |
| JP | 2007-283410 A | 11/2007 |
| JP | 2008-094649 A | 4/2008 |
| JP | 2008-156215 A | 7/2008 |
| JP | 4219718 B2 | 2/2009 |
| JP | 2009-117782 A | 5/2009 |
| JP | 2009-297814 A | 12/2009 |
| JP | 4506399 B2 | 7/2010 |
| WO | 2013/146990 A1 | 10/2013 |

* cited by examiner

Fig. 1( a )
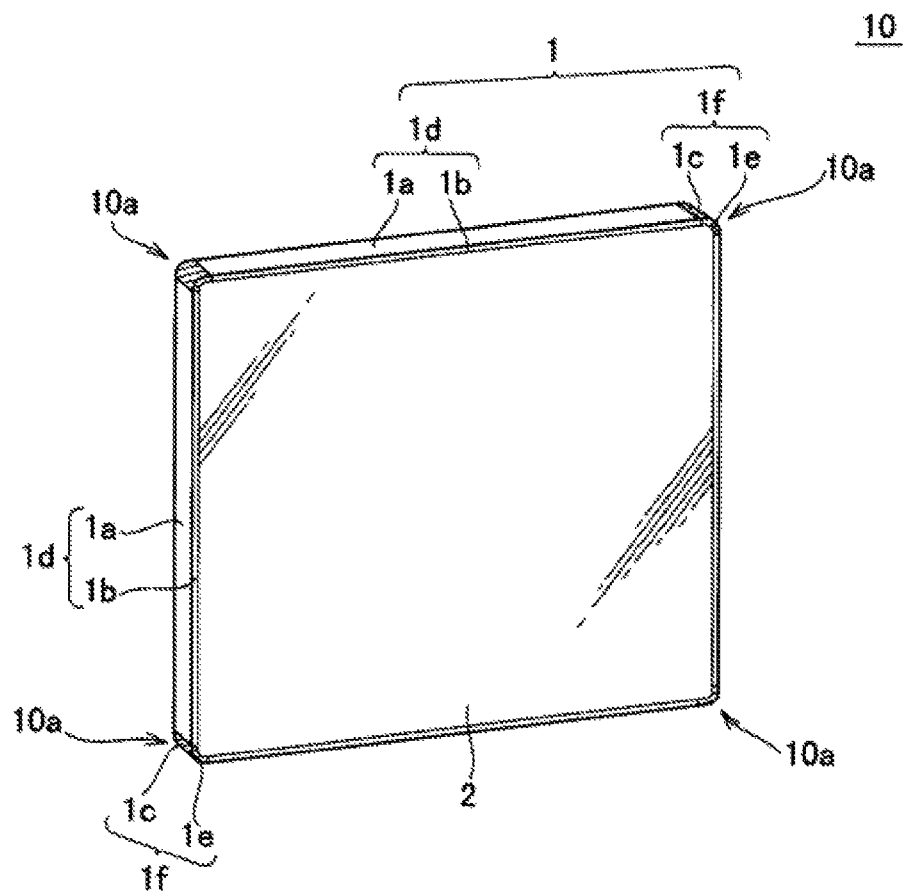
Fig. 1( b )
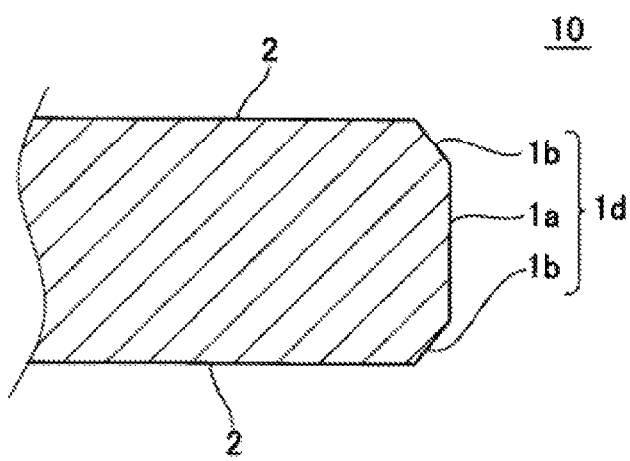

MASK BLANK SUBSTRATE, SUBSTRATE WITH MULTILAYER REFLECTIVE FILM, REFLECTIVE MASK BLANK, REFLECTIVE MASK, METHOD OF MANUFACTURING MASK BLANK SUBSTRATE, METHOD OF MANUFACTURING SUBSTRATE WITH REFLECTIVE FILM AND METHOD OF MANUFACTURING SEMICONDUCTOR DEVICE

CROSS REFERENCE TO RELATED APPLICATIONS

This application is a National Stage of International Application No. PCT/JP2013/085049, filed Dec. 27, 2013, claiming priority based on Japanese Patent Application No. 2012-287376, filed Dec. 28, 2012, the contents of all of which are incorporated herein by reference in their entirety.

TECHNICAL FIELD

The present invention relates to a mask blank substrate, which suppresses detection of pseudo defects caused by surface roughness of the substrate and facilitates the discovery of contaminants or scratches and other critical defects in defect inspections using highly sensitive defect inspection apparatuses, a substrate with a multilayer reflective film obtained from that substrate, a reflective mask blank, a reflective mask, a method of manufacturing the mask blank substrate, a method of manufacturing the substrate with a multilayer reflective film, and a method of manufacturing a semiconductor device using the aforementioned reflective mask.

BACKGROUND ART

Accompanying the increasingly higher levels of integration of semiconductor devices in the semiconductor industry in recent years, there is a growing need for fine patterns that exceed the transfer limitations of conventional photolithography methods using ultraviolet light. Extreme ultraviolet (EUV) lithography is considered to be promising as an exposure technology that uses EUV light to enable the formation of such fine patterns. Here, EUV light refers to light in the wavelength band of the soft X-ray region or vacuum ultraviolet region, and more specifically, light having a wavelength of about 0.2 nm to 100 nm. Reflective masks have been proposed as transfer masks for use in this EUV lithography. Such reflective masks have a multilayer reflective film that reflects exposure light formed on a substrate, and an absorber film that absorbs exposure light is formed in a pattern shape on the multilayer reflective film.

The reflective mask is manufactured from a reflective mask blank having a substrate, a multilayer reflective film formed on the substrate, and an absorber film formed on the multilayer reflective film, by forming an absorber film pattern by photolithography and the like.

As has been described above, due to the growing demand for miniaturization in the lithography process, significant problems are being encountered in that process. One of these is the problem relating to defect information of mask blank substrates used in the lithography process.

Mask blank substrates are being required to have even higher smoothness from the viewpoints of improving defect quality accompanying the miniaturization of patterns in recent years and the optical properties required of transfer masks. Examples of conventional surface processing methods used for mask blank substrates include those described in Patent Literatures 1 to 3.

Patent Literature 1 describes a glass substrate polishing method comprising polishing the surface of a glass substrate having $SiO_2$ as a main component thereof so that surface roughness Rms as measured with an atomic force microscope is not more than 0.15 nm using a polishing slurry, which contains colloidal silica having an average primary particle diameter of not more than 50 nm, acid and water, and is obtained by adjusting the pH to within the range of 0.5 to 4.

Patent Literature 2 describes an abrasive for a synthetic quartz glass substrate containing an inhibitory colloidal solution and an acidic amino acid for inhibiting the formation of defects detected by a highly sensitive defect detection apparatus on the surface of a synthetic quartz glass substrate.

Patent Literature 3 describes a method for controlling surface flatness of a quartz glass substrate that is capable of controlling surface flatness at the sub-nanometer level by placing a quartz glass substrate in a hydrogen radical etching apparatus and allowing hydrogen radicals to act on the quartz glass substrate.

In addition, Patent Literature 4 describes a method of manufacturing a glass substrate for an EUV mask blank, wherein irregularities are measured on the surface of the glass substrate, flatness of the glass substrate surface is controlled by carrying out local processing under processing conditions corresponding to the degree of unevenness of convex sites, and surface roughness and surface defects caused by local processing are improved and removed by carrying out non-contact polishing such as elastic emission machining (EEM) on the glass substrate surface subjected to local processing.

Conventionally, mask blank substrates have been subjected to surface processing to enhance flatness of the surface thereof by using these methods, for example.

Furthermore, Patent Literatures 5 and 6 describe the application of catalyst-referred etching (CARE) in order to flatten semiconductor substrates such as SiC, sapphire or GaN substrates.

PRIOR ART LITERATURE

Patent Literature

Patent Literature 1: JP 2006-35413A
Patent Literature 2: JP 2009-297814A
Patent Literature 3: JP 2008-94649A
Patent Literature 4: JP 4219718B
Patent Literature 5: JP 4506399B
Patent Literature 6: JP 2009-117782A

DISCLOSURE OF THE INVENTION

Problems to be Solved by the Invention

Accompanying the rapid pace of pattern miniaturization in lithography using ArF excimer lasers and EUV light, the defect size of binary masks, phase-shifting masks and other types of transparent masks (also referred to as optical masks), as well as EUV masks that are reflective masks, is becoming increasingly small year by year, and the inspection light source wavelengths used during defect inspections are approaching the light source wavelength of the exposure light in order to discover such fine defects.

For example, highly sensitive defect inspection apparatuses having an inspection wavelength of 193 nm are being used increasingly frequently as defect inspection apparatuses of optical masks and EUV mask blanks that are masters thereof and substrates, while highly sensitive defect inspection apparatuses having an inspection light source wavelength of 266 nm, 193 nm or 13.5 nm are being used increasingly frequently or are being proposed for use as defect inspection apparatuses of EUV masks and EUV mask blanks that are masters thereof and substrates.

Here, the main surfaces of substrates used in conventional transfer masks are subjected to surface processing using methods such as those described in the section entitled "Background Art" to enhance the flatness and surface roughness (smoothness) thereof. Surface roughness typically represented by root mean square roughness (Rms) or maximum roughness (Rmax) is used as an indicator of the smoothness thereof. However, regardless of the degree to which smoothness based on Rms and Rmax is enhanced from the viewpoint of improving defect quality, due to the high detection sensitivity of the aforementioned highly sensitive defect inspection apparatuses, the problem occurs in which pseudo defects are detected resulting in an excessively large number of detected defects (number of detected defects=critical defects+pseudo defects) when the main surfaces of substrates are inspected for defects.

Pseudo defects as mentioned here refer to surface irregularities that are permitted to be present on a substrate surface and do not have an effect on pattern transfer, and end up being incorrectly assessed as defects in the case of having been inspected with a highly sensitive defect inspection apparatus. If an excessively large number of such pseudo defects are detected in a defect inspection, critical defects that have an effect on pattern transfer end up being concealed in the large number of pseudo defects, thereby preventing critical defects from being discovered. For example, in the case of currently popular defect inspection apparatuses having an inspection light source wavelength of 266 nm, 193 nm or 13.5 nm, more than 100,000 defects end up being detected in a measurement region measuring, for example, 132 mm×132 mm, thereby preventing inspection for the presence of critical defects. Overlooking critical defects in a defect inspection results in defective quality in the subsequent semiconductor device mass production process and leads to unnecessary labor and economic loss.

Therefore, an object of the present invention is to provide a mask blank substrate that enables critical defects to be reliably detected as a result of reducing the number of detected defects, including pseudo defects, even when using highly sensitive defect inspection apparatuses that use light of various wavelengths, a substrate with a multilayer reflective film obtained by using that substrate, a reflective mask blank, a reflective mask, a method of manufacturing the mask blank substrate, a method of manufacturing the substrate with a multilayer reflective film, and a method of manufacturing a semiconductor device that uses the aforementioned reflective mask.

Means for Solving the Problems

The surface morphology of a mask blank substrate is extremely fine, and the morphology thereof can be determined by dividing it into waves of various wavelengths, and can be divided into regions having low spatial frequency, intermediate spatial frequency and high spatial frequency. Precise specifications relating to surface morphology are required with respect to the surfaces of mask blank substrates, and particularly substrates for EUV mask blanks, from the viewpoints of transfer performance, defect inspection performance and the like.

(1) Low Spatial Frequency Region (Low Spatial Frequency Roughness, LSFR)

A value of not more than 30 nm is required with respect to morphology and flatness in a measurement region measuring 132 mm×132 mm from the viewpoint of transfer pattern positional accuracy.

(2) Intermediate Spatial Frequency Region (Intermediate Spatial Frequency Roughness, MSFR)

Since undulations in this range cause a decrease in pattern contrast attributable to stray light referred to as flare that is generated during pattern transfer, a value of not more than 200 μrad is required at a spatial wavelength of 2 μm to 1 mm.

(3) High Spatial Frequency Region (High Spatial Frequency Roughness, HSFR)

From the viewpoint of reflectance properties of a multilayer reflective film formed on a substrate, a value of not more than 0.15 nm is required with respect to surface roughness in terms of root mean square roughness (Rms).

Although various processing methods for obtaining high flatness and high smoothness have been proposed in the past, a processing method has yet to be established that enables the aforementioned substrate surface morphologies (LSFR, MSFR and HSFR) to be reliably obtained. In addition, the correlation between these surface morphologies and the number of defects, including pseudo defects, detected by highly sensitive defect detection apparatuses has been completely unknown.

As a result of conducting extensive studies to solve the aforementioned problems, the inventors of the present invention found that roughness of a prescribed spatial frequency (or spatial wavelength) component correlates with the number of defects, including pseudo defects, detected with respect to the inspection light source wavelength of a highly sensitive defect inspection apparatus. Therefore, the number of defects, including pseudo defects, detected in a defect inspection can be inhibited by specifying the spatial frequency of a roughness component among the roughness (surface irregularity) components on the surface of a substrate main surface that is incorrectly assessed as a pseudo defect by a highly sensitive defect inspection apparatus, and by managing amplitude intensity (power spectral density) at that spatial frequency (either MSFR or HSFR).

Namely, the present invention has the configurations indicated below.

(Configuration 1)

Configuration 1 of the present invention is a mask blank substrate that is used in lithography, wherein the power spectral density at a spatial frequency of $1 \times 10^{-2}$ μm$^{-1}$ to 1 μm$^{-1}$, obtained by measuring a 0.14 mm×0.1 mm region on a main surface of the mask blank substrate on the side of which a transfer pattern is formed at 640×480 pixels with a white-light interferometer, is not more than $4 \times 10^6$ nm$^4$, and the power spectral density at a spatial frequency of not less than 1 μm$^{-1}$, obtained by measuring a 1 μm×1 μm region on the main surface with an atomic force microscope, is not more than 10 nm$^4$.

According to the aforementioned Configuration 1, as a result of setting the power spectral density (PSD) that is amplitude intensity of the roughness component in an intermediate spatial frequency region ($1 \times 10^{-2}$ μm$^{-1}$ to 1 μm$^{-1}$) detected at 640×480 pixels with a white-light interferometer in a 0.14 mm×0.1 mm region on a main surface of a mask blank substrate to not more than $4 \times 10^6$ nm$^4$, and setting the power spectral density of a roughness component in a high spatial frequency region (not less than 1 µm$^{-1}$) detected in a 1 µm×1 µm region to not more than 10 nm$^4$, detection of pseudo defects in a defect inspection using a highly sensitive defect inspection apparatus using inspection light in the wavelength region of 150 nm to 365 nm (such as that of a UV laser having a wavelength of 266 nm or ArF excimer laser having a wavelength of 193 nm) or EUV light at 13.5 nm can be inhibited, thereby making it possible to make critical defects more conspicuous. When carrying out a defect inspection on the surface of a substrate with a multilayer reflective film obtained by forming a multilayer reflective film on the aforementioned mask blank substrate by means of, in particular, a highly sensitive defect inspection apparatus using EUV light at 13.5 nm, since scattering (speckling) occurring due to especially roughness of the multilayer reflective film can be inhibited, a mask blank substrate can be obtained that enables defect inspections to be carried out reliably by reducing the effects of speckling in defect inspections under highly sensitive inspection conditions (such as inspection sensitivity conditions enabling detection of defects of a size of 15 nm in terms of sphere equivalent volume diameter (SEVD)).

(Configuration 2)

Configuration 2 of the present invention is the mask blank substrate described in Configuration 1, wherein the root mean square roughness (Rms) obtained by measuring a 1 µm×1 µm region of the aforementioned main surface with an atomic force microscope is less than 0.13 nm.

According to the aforementioned Configuration 2, by setting the root mean square roughness to not more than a prescribed value, since the surface of a multilayer reflective film has surface roughness equivalent to the surface of the mask blank substrate when the multilayer reflective film is formed on the mask blank substrate, reflectance properties of the multilayer reflective film with respect to EUV light can be enhanced.

(Configuration 3)

Configuration 3 of the present invention is the mask blank substrate described in Configuration 1 or 2, wherein the power spectral density at a spatial frequency of 1 µm$^{-1}$ to 10 µm$^{-1}$ obtained by measuring a 1 µm×1 µm region on the aforementioned main surface with an atomic force microscope is 1 nm$^4$ to 10 nm$^4$.

According to the aforementioned Configuration 3, by setting PSD in this spatial frequency region to within the aforementioned range, the number of defects, including pseudo defects, detected in a defect inspection using a highly sensitive defect inspection apparatus using a wavelength region of 150 nm to 365 nm (such as a wavelength of 266 nm or 193 nm) for the wavelength of the inspection light source can be reduced.

(Configuration 4)

Configuration 4 of the present invention is the mask blank substrate described in any of Configurations 1 to 3, wherein the aforementioned substrate is a mask blank substrate used in EUV lithography.

According to the aforementioned Configuration 4, if the mask blank substrate is made to be a mask blank substrate used in EUV lithography, since the surface morphology of the surface of a multilayer reflective film formed on the aforementioned main surface is highly smooth as well, reflectance properties of the multilayer reflective film with respect to EUV light are favorable, making this preferable for EUV lithography.

(Configuration 5)

Configuration 5 of the present invention is a substrate with a multilayer reflective film comprising a multilayer reflective film, in which a high refractive index layer and a low refractive index layer are alternately laminated, on the aforementioned main surface of the mask blank substrate described in any of Configurations 1 to 4.

According to the aforementioned Configuration 5, since surface morphology of the surface of the multilayer reflective film formed on the aforementioned main surface is highly smooth, reflectance properties thereof with respect to EUV light are favorable. In addition, regarding the substrate with a multilayer reflective film, the number of defects, including pseudo defects, detected in a defect inspection of the surface of the multilayer reflective film using, e.g., a highly sensitive defect inspection apparatus that uses light of 266 nm, 193 nm or 13.5 nm for the wavelength of the inspection light source can be reduced considerably, thereby further making it possible to make critical defects more conspicuous.

(Configuration 6)

Configuration 6 of the present invention is the substrate with a multilayer reflective film described in Configuration 5, further comprising a protective film on the aforementioned multilayer reflective film.

According to the aforementioned Configuration 6, since damage to the surface of the multilayer reflective film when manufacturing a transfer mask (EUV mask) can be inhibited by having a protective film on the multilayer reflective film, reflectance properties of the multilayer reflective film with respect to EUV light are further favorable. In addition, regarding the substrate with a multilayer reflective film, the number of defects, including pseudo defects, detected in a defect inspection of the surface of the protective film using, e.g., a highly sensitive defect inspection apparatus that uses light of 266 nm, 193 nm or 13.5 nm for the wavelength of the inspection light source can be reduced considerably, thereby further making it possible to make critical defects more conspicuous.

(Configuration 7)

Configuration 7 of the present invention is a substrate with a multilayer reflective film having a multilayer reflective film, in which a high refractive index layer and a low refractive index layer are alternately laminated, on a main surface of a mask blank substrate used in lithography, wherein the power spectral density at a spatial frequency of $1\times10^{-2}$ µm$^{-1}$ to 1 µm$^{-1}$, obtained by measuring a 0.14 mm×0.1 mm region on a surface of the aforementioned substrate with a multilayer reflective film on the side of which the aforementioned multilayer reflective film is formed at 640×480 pixels with a white-light interferometer, is not more than $4\times10^7$ nm$^4$, and the power spectral density at a spatial frequency of 1 µm$^{-1}$ to 100 µm$^{-1}$, obtained by measuring a 1 µm×1 µm region on the surface of the substrate with a multilayer reflective film with an atomic force microscope, is not more than 20 nm$^4$.

According to the aforementioned Configuration 7, by setting the power spectral density (PSD) that is amplitude intensity of the roughness component in an intermediate spatial frequency region ($1\times10^{-2}$ µm$^{-1}$ to 1 µm$^{-1}$) detected at 640×480 pixels with a white-light interferometer in a 0.14 mm×0.1 mm region on the surface of a substrate with a multilayer reflective film on the side where the multilayer reflective film is formed to not more than $4\times10^7$ nm$^4$, and setting the power spectral density of a roughness component in a high spatial frequency region (not less than 1 µm$^{-1}$) detected in a 1 µm×1 µm region to not more than 20 nm$^4$, detection of pseudo defects in a defect inspection using a highly sensitive defect inspection apparatus using inspection light in the wavelength region of 150 nm to 365 nm (such as that of a UV laser having a wavelength of 266 nm or ArF excimer laser having a wavelength of 193 nm) or EUV light at 13.5 nm can be inhibited, thereby making it possible to make critical defects more conspicuous. In particular, when carrying out a defect inspection on the surface of a substrate with a multilayer reflective film with a highly sensitive defect inspection apparatus using 13.5 nm EUV light, since scattering on the surface of the substrate with a multilayer reflective film can be inhibited, a substrate with a multilayer reflective film can be obtained that enables defect inspections to be carried out reliably under highly sensitive inspection conditions (such as inspection sensitivity conditions enabling detection of defects of a size of 15 nm in terms of SEVD).

(Configuration 8)

Configuration 8 of the present invention is the substrate with a multilayer reflective film described in Configuration 7, wherein the root mean square roughness (Rms) obtained by measuring a 1 µm×1 µm region of the surface of the aforementioned substrate with a multilayer reflective film with an atomic force microscope is less than 0.13 nm.

According to the aforementioned Configuration 8, by setting the root mean square roughness to not more than a prescribed value, reflectance properties of the multilayer reflective film with respect to EUV light can be enhanced.

(Configuration 9)

Configuration 9 of the present invention is the substrate with a multilayer reflective film described in Configuration 7 or 8, further comprising a protective film on the aforementioned multilayer reflective film.

According to the aforementioned Configuration 9, since damage to the surface of the multilayer reflective film when manufacturing a transfer mask (EUV mask) can be inhibited by having a protective film on the multilayer reflective film, reflectance properties of the multilayer reflective film with respect to EUV light are more favorable. In addition, regarding a substrate with a multilayer reflective film, the number of defects, including pseudo defects, detected in a defect inspection of the surface of the protective film using, e.g., a highly sensitive defect inspection apparatus that uses light of 266 nm, 193 nm or 13.5 nm for the wavelength of the inspection light source can be reduced considerably, thereby further making it possible to make critical defects more conspicuous. In addition, since scattering on the surface of the protective film can be inhibited when carrying out a defect inspection of the surface of the protective film with a highly sensitive defect inspection apparatus using 13.5 nm EUV light, defect inspections can be carried out reliably under highly sensitive inspection conditions (such as inspection sensitivity conditions enabling detection of defects of a size of 15 nm in terms of SEVD).

(Configuration 10)

Configuration 10 of the present invention is a reflective mask blank comprising an absorber film to serve as a transfer pattern on the aforementioned multilayer reflective film or protective film of the substrate with a multilayer reflective film described in any of Configurations 5 to 9.

According to the aforementioned Configuration 10, regarding a reflective mask blank, the number of defects, including pseudo defects, detected in a defect inspection using a highly sensitive defect inspection apparatus that uses light of 266 nm, 193 nm or 13.5 nm for the wavelength of the inspection light source can be reduced, thereby further making it possible to make critical defects more conspicuous.

(Configuration 11)

Configuration 11 of the present invention is a reflective mask having an absorber pattern, obtained by patterning the aforementioned absorber film in the reflective mask blank described in Configuration 10, on the aforementioned multilayer reflective film or protective film.

According to the aforementioned Configuration 11, regarding a reflective mask, the number of defects, including pseudo defects, detected in a defect inspection using a highly sensitive defect inspection apparatus can be reduced, thereby further making it possible to make critical defects more conspicuous.

(Configuration 12)

Configuration 12 of the present invention is a method of manufacturing a mask blank substrate having a surface processing step for processing a main surface of a mask blank substrate used in lithography on the side of which a transfer pattern is formed so as to obtain a prescribed surface morphology, wherein the aforementioned surface processing step is a step for surface processing such that the power spectral density at a spatial frequency of $1 \times 10^{-2}$ µm$^{-1}$ to obtained by measuring a 0.14 mm×0.1 mm region on the aforementioned main surface at 640×480 pixels with a white-light interferometer, is not more than $4 \times 10^6$ nm$^4$, and the power spectral density at a spatial frequency of not less than 1 µm$^{-1}$, obtained by measuring a 1 µm×1 µm region on the aforementioned main surface with an atomic force microscope, is not more than 10 nm$^4$.

According to the aforementioned Configuration 12, by carrying out a prescribed surface processing such that, in a mask blank substrate used in lithography, PSD in an intermediate spatial frequency region, obtained by measuring a 0.14 mm×0.1 mm region on the main surface on the side where a transfer pattern is formed at 640×480 pixels with a white-light interferometer, is not more than $4 \times 10^6$ nm$^4$, and PSD in a high spatial frequency region detected in a 1 µm×1 µm region is not more than 10 nm$^4$, the number of defects, including pseudo defects, detected in a defect inspection using the aforementioned highly sensitive defect inspection apparatus using inspection light in the wavelength region of 150 nm to 365 nm (such as a UV laser having a wavelength of 266 nm or ArF excimer laser having a wavelength of 193 nm), or EUV light of 13.5 nm, can be reduced, thereby making it possible to manufacture the mask blank substrate of the present invention that enables critical defects to be made more conspicuous. Since scattering on the surface of a substrate with a multilayer reflective film can be inhibited when carrying out a defect inspection on the surface of the substrate with a multilayer reflective film with a highly sensitive defect inspection apparatus using 13.5 nm EUV light in particular, a mask blank substrate can be obtained that enables defect inspections to be carried out reliably under highly sensitive inspection conditions (such as inspection sensitivity conditions enabling detection of defects of a size of 15 nm in terms of SEVD).

(Configuration 13)

Configuration 13 of the present invention is the method of manufacturing a mask blank substrate described in Configuration 12, wherein the aforementioned surface processing step has an intermediate spatial frequency region roughness reducing step for surface processing such that the power spectral density at a spatial frequency of $1 \times 10^{-2}$ µm$^{-1}$ to 1 µm$^{-1}$, obtained by measuring a 0.14 mm×0.1 mm region on the aforementioned main surface at 640×480 pixels with a white-light interferometer, is not more than $4 \times 10^6$ nm$^4$, and a high spatial frequency region roughness reducing step for surface processing such that the power spectral density at a spatial frequency of not less than 1 µm$^{-1}$, obtained by measuring a 1 µm×1 µm region on the aforementioned main surface with an atomic force microscope, is not more than 10 nm$^4$.

According to the aforementioned Configuration 13, by carrying out two surface processing steps for reducing roughness in an intermediate spatial frequency region and reducing roughness in a high spatial frequency region, a mask blank substrate can be preferably manufactured that satisfies the aforementioned PSD conditions.

(Configuration 14)

Configuration 14 of the present invention is the method of manufacturing a mask blank substrate described in Configuration 13, wherein the high spatial frequency region roughness reducing step is carried out after the intermediate spatial frequency region roughness reducing step.

According to the aforementioned Configuration 14, by carrying out surface processing in the order of an intermediate spatial frequency region roughness reducing step followed by a high spatial frequency region roughness reducing step, since intermediate spatial frequency region roughness is resistant to change caused by surface processing of the high spatial frequency region roughness reducing step, roughness in both ranges can be effectively reduced to manufacture the mask blank substrate of the present invention.

(Configuration 15)

Configuration 15 of the present invention is the method of manufacturing a mask blank substrate described in any of Configurations 12 to 14, wherein the aforementioned surface processing step is carried out by elastic emission machining (EEM) and/or catalyst-referred etching (CARE).

According to the aforementioned Configuration 15, by carrying out the surface processing step by EEM and/or CARE, roughness in the intermediate spatial frequency region and high spatial frequency region can be effectively reduced.

(Configuration 16)

Configuration 16 of the present invention is the method of manufacturing a mask blank substrate described in Configuration 13 or 14, wherein the aforementioned intermediate spatial frequency region roughness reducing step is carried out by processing the aforementioned main surface by EEM.

According to the aforementioned Configuration 16, since EEM is preferable for reducing roughness in the intermediate spatial frequency region, a mask blank substrate can be manufactured in which roughness in the intermediate spatial frequency region is particularly preferably reduced.

(Configuration 17)

Configuration 17 of the present invention is the method of manufacturing a mask blank substrate described in any of Configurations 13 to 16, wherein the aforementioned high spatial frequency region roughness reducing step is carried out by processing the aforementioned main surface by catalyst-referred etching.

According to the aforementioned Configuration 17, since catalyst-referred etching is preferable for reducing roughness in the high spatial frequency region, a mask blank substrate can be manufactured in which roughness in the high spatial frequency region is particularly preferably reduced.

(Configuration 18)

Configuration 18 of the present invention is the method of manufacturing a mask blank substrate described in any of Configurations 12 to 17, wherein the aforementioned substrate is a mask blank substrate used in EUV lithography.

According to the aforementioned Configuration 18, if the mask blank substrate is used for EUV lithography, since the surface morphology of the surface of a multilayer reflective film formed on the aforementioned main surface is highly smooth, reflectance properties of the multilayer reflective film with respect to EUV light become favorable, thereby making this preferable for EUV lithography.

(Configuration 19)

Configuration 19 of the present invention is a method of manufacturing a substrate with a multilayer reflective film having a multilayer reflective film formation step for forming a multilayer reflective film, in which a high refractive index layer and a low refractive index layer are alternately laminated, on the aforementioned main surface of the mask blank substrate described in any of Configurations 1 to 4 or a mask blank substrate manufactured by the manufacturing method described in any of Configurations 12 to 18.

According to the aforementioned Configuration 19, since the surface morphology of the surface of the multilayer reflective film formed on the aforementioned main surface is highly smooth, reflectance properties with respect to EUV light are favorable. In addition, regarding a substrate with a multilayer reflective film, the number of defects, including pseudo defects, detected in a defect inspection of the surface of the multilayer reflective film using, e.g., a highly sensitive defect inspection apparatus that uses light of 266 nm, 193 nm or 13.5 nm for the wavelength of the inspection light source can be reduced, thereby further making it possible to make critical defects more conspicuous. In particular, since scattering on the surface of the substrate with a multilayer reflective film can be inhibited when carrying out a defect inspection of the surface of the substrate with a multilayer reflective film with a highly sensitive defect inspection apparatus using 13.5 nm EUV light, a substrate with a multilayer reflective film can be obtained for which defect inspections can be carried out reliably under highly sensitive inspection conditions (such as inspection sensitivity conditions enabling detection of defects of a size of 15 nm in terms of SEVD).

(Configuration 20)

Configuration 20 of the present invention is the method of manufacturing a substrate with a multilayer reflective film described in Configuration 19, wherein the aforementioned multilayer reflective film formation step is carried out by alternately depositing the aforementioned high refractive index layer and the low refractive index layer by ion beam sputtering.

According to the aforementioned Configuration 20, by forming a laminate consisting of alternating high refractive index and low refractive index layers by ion beam sputtering, a substrate with a multilayer reflective film can be efficiently manufactured that has superior smoothness, and for that reason, has a multilayer reflective film having superior reflectance properties with respect to EUV light.

(Configuration 21)

Configuration 21 of the present invention is the method of manufacturing a substrate with a multilayer reflective film described in Configuration 20, wherein, in the aforementioned multilayer reflective film formation step, the aforementioned multilayer reflective film is formed by making sputtered particles of a high refractive index material and a low refractive index material enter alternately at an incident angle of 0 degree to 30 degrees relative to the normal of the aforementioned main surface by ion beam sputtering using a target of a high refractive index material and a low refractive index material.

According to the aforementioned Configuration 21, by forming a multilayer reflective film by making sputtered particles of a high refractive index material and a low refractive index material enter alternately at an incident angle of 0 degree to 30 degrees relative to the normal of the aforementioned main surface of the substrate by ion beam sputtering using targets consisting of the high refractive index material and low refractive index material, a substrate with a multilayer reflective film can be efficiently manufactured that has a multilayer reflective film having even more superior smoothness and superior reflectance properties with respect to EUV light.

(Configuration 22)

Configuration 22 of the present invention is the method of manufacturing a substrate with a multilayer reflective film described in any of Configurations 19 to 21, further having a step for forming a protective film on the aforementioned multilayer reflective film.

According to the aforementioned Configuration 22, since damage to the surface of the multilayer reflective film when manufacturing a transfer mask (EUV mask) can be inhibited by forming a protective film on the multilayer reflective film, reflectance properties of the multilayer reflective film with respect to EUV light are more favorable. In addition, regarding the substrate with a multilayer reflective film, the number of defects, including pseudo defects, detected in a defect inspection of the surface of the protective film using, e.g., a highly sensitive defect inspection apparatus that uses light of 266 nm, 193 nm or 13.5 nm for the wavelength of the inspection light source can be reduced, thereby further enabling critical defects to be made more conspicuous.

(Configuration 23)

Configuration 23 of the present invention is a method of manufacturing a semiconductor device, having a step for forming a transfer pattern on a workpiece by carrying out a lithography process that uses an exposure apparatus using the reflective mask described in Configuration 11

According to the aforementioned Configuration 23, a reflective mask from which contaminants, scratches and other critical defects have been removed can be used in a defect inspection using a highly sensitive defect inspection apparatus, the number of defects, including pseudo defects, detected in the inspection is reduced considerably, and unnecessary costs are reduced. For this reason, in a resist film formed on a workpiece such as a semiconductor substrate, a transfer pattern such as a circuit pattern that is transferred using the aforementioned mask is free of defects, and a semiconductor device having a fine and highly precise transfer pattern can be economically and advantageously manufactured.

Effects of the Invention

According to the present invention, a mask blank substrate, which enables critical defects to be reliably detected since the number of defects, including pseudo defects, detected is reduced even when using highly sensitive defect inspection apparatuses using light of various wavelengths, a substrate with a multilayer reflective film obtained by using the substrate, a reflective mask blank, a reflective mask, a method of manufacturing the aforementioned mask blank substrate, a method of manufacturing the aforementioned substrate with a multilayer reflective film, and a method of manufacturing a semiconductor device that uses the aforementioned reflective mask, are provided.

BRIEF DESCRIPTION OF THE DRAWINGS

FIG. 1(a) is a perspective view showing a mask blank substrate 10 according to one embodiment of the present invention. FIG. 1(b) is a cross-sectional schematic diagram showing the mask blank substrate 10 of the present embodiment.

DESCRIPTION OF EMBODIMENTS

[Mask Blank Substrate]

Figure 2:
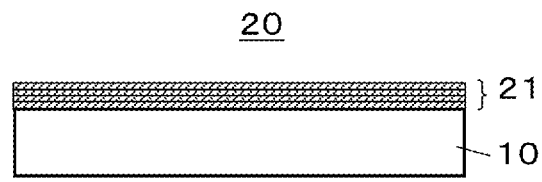
FIG. 2 is a cross-sectional schematic diagram showing one example of the configuration of a substrate with a multilayer reflective film according to one embodiment of the present invention.

First, an explanation is provided of a mask blank substrate according to one embodiment of the present invention below.

FIG. 1(a) is a perspective view showing a mask blank substrate 10 of the present embodiment. FIG. 1(b) is a cross-sectional schematic diagram showing the mask blank substrate 10 of the present embodiment.

The mask blank substrate 10 (or simply, substrate 10) is a rectangular plate-like body that has two opposing main surfaces 2 and edge faces 1. The two opposing main surfaces 2 constitute an upper surface and a lower surface of this plate-like body, and are formed so as to be mutually opposed. In addition, at least one of the two opposing main surfaces 2 is the main surface on which a transfer pattern is to be formed.

The edge faces 1 constitute the lateral surfaces of this plate-like body, and are adjacent to the outer edges of the opposing main surfaces 2. The edge faces 1 have a flat edge face portion 1d and curved edge face portions 1f. The flat edge face portion 1d is a surface that connects a side of one of the opposing main surfaces 2 and a side of the other opposing main surface 2, and includes a lateral surface portion 1a and chamfered inclined surface portions 1b. The lateral surface portion 1a is a portion that is nearly perpendicular to the opposing main surfaces 2 in the flat edge face portion 1d (T surface). The chamfered inclined surface portions 1b are portions that are chamfered between the lateral surface portion 1a and the opposing main surfaces 2 (C surface), and are formed between the lateral surface portion 1a and the opposing main surfaces 2.

The curved edge face portions 1f are portions adjacent to the vicinity of corner portions 10a of the substrate 10 when the substrate 10 is viewed from overhead (R portions), and include a lateral surface portion 1c and a chamfered inclined surface portions 1e. Here, "the substrate 10 is viewed from overhead" means that the substrate 10 is seen from a direction perpendicular to the opposing main surfaces 2. In addition, the corner portions 10a of the substrate 10 refer to, for example, locations in the vicinity of the intersections of two sides along the outer edges of the opposing main surfaces 2. The intersections of two sides may also be intersections of lines respectively extending from each of the two sides. In the present example, the curved edge face portions if are formed to have a curved shape by rounding the corner portion 10a of the substrate 10.

In order to achieve the aforementioned object, the present invention is characterized in that, in at least a main surface on the side of which a transfer pattern is formed, namely in a reflective mask blank to be subsequently described, the main surface on the side of which a multilayer reflective film 21, a protective film 22 or an absorber film 24 is formed has a specific power spectral density (PSD) in a specific spatial frequency region.

The following provides an explanation of power spectral density (PSD) that is a parameter indicating surface morphology of a main surface of the mask blank substrate 10 of the present invention, and other parameters preferably satisfied by the mask blank substrate 10 of the present invention i.e., surface roughness (Rms) and flatness.

<Power Spectral Density>

Surface irregularities in the surface of the mask blank substrate 10 obtained by measuring the substrate surface with, for example, a white-light interferometer or atomic force microscope, can be expressed as amplitude intensity at a prescribed spatial frequency by Fourier transform. This consists of representing measurement data of the surface irregularities (namely, the micromorphology of the substrate surface) as the sum of the waves of prescribed spatial frequencies, or in other words, dividing the surface morphology of the substrate into the waves of prescribed spatial frequencies.

This type of power spectral analysis makes it possible to quantify the surface micromorphology of the substrate. If $Z(x,y)$ is taken to be the height data (numerical value) at a specific x,y coordinate in the surface morphology, then the Fourier transform thereof is given by the following equation (2).

[Equation 1]

$$F(u, v) = \frac{1}{N_x N_y} \sum_{x=0}^{N_x-1} \sum_{y=0}^{N_y-1} Z(x, y) \exp\left[-i2\pi\left(\frac{ux}{N_x} + \frac{vy}{N_y}\right)\right] \quad (2)$$

Here, Nx and Ny are the number of data sets in the x direction and y direction. u=0, 1, 2, ... Nx−1, and v=0, 1, 2, ... Ny−1, then the spatial frequency f is given by the following equation (3).

[Equation 2]

$$f = \left\{\left[\frac{u}{(N_x-1)d_x}\right]^2 + \left[\frac{v}{(N_y-1)d_y}\right]^2\right\}^{1/2} \quad (3)$$

(Wherein, $d_x$ represents minimum resolution in the x direction and $d_y$ represents minimum resolution in the y direction.)

The power spectral density (PSD) at this time is given by the following equation (4).

[Equation 3]

$$P(u,v)=|F(u,v)|^2 \quad (4)$$

This power spectral analysis is superior in that it enables changes in the surface morphology of a substrate to be perceived not only as a simple change in height, but also as a change at that spatial frequency, and is a technique used to analyze the effects of microreactions at the atomic level on the surface of the substrate.

In order to achieve the aforementioned object, the mask blank substrate 10 of the present invention is such that the PSD in a spatial frequency region of $1\times10^{-2}$ μm$^{-1}$ to 1 μm$^{-1}$, obtained by measuring a 0.14 mm×0.1 mm region on a main surface on the side where a transfer pattern is formed at 640×480 pixels with a white-light interferometer, is not more than $4\times10^6$ nm$^4$, and the PSD at a spatial frequency of not less than 1 μm$^{-1}$, obtained by measuring a 1 μm×1 μm region with an atomic force microscope, is not more than 10 nm$^4$.

In the present specification, the aforementioned 0.14 mm×0.1 mm region and the aforementioned 1 μm×1 μm region are regions centering on the mask blank substrate 10. For example, if a main surface of the mask blank substrate 10 has a rectangular shape, the center is located at the intersection of diagonal lines of the rectangle. Namely, the intersection and the center of the regions coincide (and the definition of the center of these regions is the same as that of the center of the substrate). This applies similarly to a multilayer reflective film, protective film and absorber film to be subsequently described.

In addition, when observing a region at a spatial frequency of $1\times10^{-2}$ μm$^{-1}$ to 1 μm$^{-1}$, observing a 0.14 mm×0.1 mm region at 640×480 pixels with a white-light interferometer yields highly reliable data, and when observing a region at a spatial frequency of 1 μm$^{-1}$ to $1\times10^2$ μm$^{-1}$, observing a 1 μm×1 μm region with an atomic force microscope yields highly reliable data. In the present invention, the PSD data for each of the previously mentioned spatial frequency regions is obtained by observing under the respective measurement conditions (such as the measurement field) mentioned as yielding highly reliable data.

Since highly sensitive defect inspection apparatuses that use a wavelength selected from the wavelength range of 150 nm to 365 nm for the wavelength of the inspection light source (such as 266 nm or 193 nm), or use EUV light (light having a wavelength of, for example, 13.5 nm), are susceptible to erroneously detecting roughness in the aforementioned high spatial frequency region of not less than 1 μm$^{-1}$ as pseudo defects, by suppressing roughness in these regions (PSD that is amplitude intensity) to not exceed a fixed value, the number of detected defects, including pseudo defects, can be reduced while being able to reliably detect critical defects that must not be failed to be detected as a result thereof.

In addition, in the case of carrying out a defect inspection on a main surface of the aforementioned mask blank substrate 10 using a highly sensitive defect inspection apparatus that uses an inspection light source in the wavelength range of 150 nm to 365 nm (such as that using a 266 nm UV laser or 193 nm ArF excimer laser for the inspection light source), PSD of the aforementioned main surface over a range of 1

$\mu m^{-1}$ to $1 \times 10^{-1}$ $\mu m^{-1}$, obtained by measuring a 1 $\mu m \times 1$ $\mu m$ region with an atomic force microscope, is preferably not more than 10 $nm^4$. From the same viewpoint, PSD over a spatial frequency region of 1 $\mu m^{-1}$ to $1 \times 10^{-1}$ $\mu m^{-1}$ is more preferably 1 $nm^4$ to 10 $nm^4$. In addition, in the case of using a highly sensitive defect inspection apparatus that uses, for example, 13.5 nm EUV light for the inspection light source, the power spectral density of the aforementioned main surface over a spatial frequency region of 10 $\mu m^{-1}$ to $100 \times 10^{-1}$ $\mu m^{-1}$, obtained by measuring a 1 $\mu m \times 1$ $\mu m$ region with an atomic force microscope, is preferably not more than 5 $nm^4$, and the power spectral density over a spatial frequency region of 10 $\mu m^{-1}$ to $100 \times 10^{-1}$ is more preferably 0.5 $nm^4$ to 5 $nm^4$.

By setting the power spectral density in a specific spatial frequency region of a main surface of the mask blank substrate 10 to within a specific range as described above, the number of defects, including pseudo defects, detected can be reduced considerably in defect inspections using, for example, the "MAGICS M7360" Mask/Substrate/Blank Defect Inspection Apparatus for EUV Exposure manufactured by Lasertec Corp., the "Teron 600 Series" of Reticle, Optical Mask, Blank, UV Mask/Blank Defect Inspection Apparatuses manufactured by KLA-Tencor Corp., or the "Actinic" Defect Inspection Apparatus using light of the same wavelength as the exposure light wavelength (EUV light). As a result, critical defects can be made to be more conspicuous, and in the case critical defects have been detected, various measures can be taken such as removing the critical defects or designing the mask so that an absorber pattern 27 is positioned over the critical defect in a reflective mask 40 described later.

Furthermore, the aforementioned wavelength of the inspection light source is not limited to 266 nm, 193 nm or 13.5 nm. Wavelengths of 532 nm, 488 nm, 364 nm and 257 nm may also be used as the wavelengths of the inspection light source. In particular, the present invention demonstrates the greatest effects in the case inspecting for defects using a highly sensitive defect inspection having an inspection light source wavelength in the range of 150 nm to 365 nm or an inspection light source wavelength of 13.5 nm.

<Surface Roughness (Rms)>

Root mean square (Rms), which is a typical indicator of surface roughness of the mask blank substrate 10, is the root mean square roughness, and is the square root of a value obtained by averaging the squares of the deviation from the average line to a measurement curve. Namely, Rms is represented by the following equation (1).

[Equation 4]

$$\text{Rms} = \sqrt{\frac{1}{l} \int_0^l Z^2(x) dx} \quad (1)$$

(Wherein, l represents a reference length, and Z represents height from the average line to the measurement curve.)

Furthermore, Rms can be obtained by measuring a 1 $\mu m \times 1$ $\mu m$ region on the main surface of the mask blank substrate 10 with an atomic force microscope.

In addition, the root mean square roughness (Rms) as described above is preferably less than 0.13 nm, more preferably not more than 0.12 nm and even more preferably not more than 0.10 nm.

The root mean square roughness (Rms) is preferably managed from the viewpoint of improving reflectance and other optical properties of the multilayer reflective film 21 formed on the mask blank substrate 10 to be subsequently described. For example, the surface roughness of the surface of the multilayer reflective film 21 (namely, the surface of a substrate with a multilayer reflective film) is preferably less than 0.13 nm, more preferably not more than 0.12 nm and even more preferably not more than 0.10 nm in terms of the root mean square roughness (Rms).

<Flatness>

In addition, a main surface of the mask blank substrate 10 of the present embodiment on the side of which a transfer pattern is formed is preferably processed so as to have high flatness from the viewpoints of at least obtaining pattern transfer accuracy and positional accuracy. In the case of an EUV reflective mask blank substrate, flatness in a 142 mm×142 mm region on the main surface of the substrate 10 on the side of which a transfer pattern is formed is preferably not more than 0.1 $\mu m$ and particularly preferably not more than 0.05 $\mu m$. In addition, the main surface on the opposite side from the side on which a transfer pattern is formed is the side that is clamped with an electrostatic chuck when the substrate is placed in an exposure apparatus, and flatness thereof in a 142 mm×142 mm region is preferably not more than 1 $\mu m$ and particularly preferably not more than 0.5 $\mu m$.

[Method of Manufacturing Mask Blank Substrate]

The mask blank substrate of the present invention as explained above can be manufactured by surface processing a main surface thereof on the side of which a transfer pattern is formed to have a prescribed surface morphology, namely such that the power spectral density at a spatial frequency of $1 \times 10^{-2}$ $\mu m^{-1}$ to 1 $\mu m^{-1}$, obtained by measuring a 0.14 mm×0.1 mm region on the aforementioned main surface at 640×480 pixels with a white-light interferometer, is not more than $4 \times 10^6$ $nm^4$, and the power spectral density at a spatial frequency of not less than 1 $\mu m^{-1}$, obtained by measuring a 1 $\mu m \times 1$ $\mu m$ region on the aforementioned main surface with an atomic force microscope, is not more than 10 $nm^4$. Furthermore, surface processing is also preferably carried out to achieve the aforementioned surface roughness (Rms). The method of that surface processing is known and can be used without any particular limitations in the present invention.

Furthermore, examples of this surface processing method include magneto rheological finishing (MRF), chemical mechanical polishing (CMP), gas cluster ion beam etching (GCIB) and dry chemical planarization (DCP) using topical plasma etching. MRF is a topical processing method in which polishing is carried out topically by allowing polishing abrasive particles contained in a magnetic fluid to contact a processing target (mask blank substrate) at a high speed together with controlling residence time at the contact portion. CMP is a topical processing method in which primarily convex portions on the surface of a processing target are polished by using a small diameter polishing pad and abrasive (containing polishing abrasive particles such as colloidal silica) and controlling the residence time of the abrasive at the contact portion between the small diameter polishing pad and the processing target (mask blank substrate). GCIB is a topical processing method that comprises generating gas cluster ions by letting a reactive substance that is gas at normal temperature and normal pressure (source gas) spout into a vacuum apparatus while allowing to expand adiabatically, and accelerating the gas cluster ions formed by ionizing by electron irradiation in a high electric field to form a gas cluster ion beam followed by irradiating the processing target therewith. DCP is a topical processing method in which dry etching is carried out topically by carrying out plasma etching topically and controlling the amount of plasma etching corresponding to the degree of convex surface.

Any material may be used for the material of the reflective mask blank substrate for EUV exposure provided it has low thermal expansion properties. For example, an $SiO_2$—$TiO_2$-based glass having low thermal expansion properties (such as a two-element system ($SiO_2$—$TiO_2$) or three-element system (such as $SiO_2$—$TiO_2$—$SnO_2$)), or so-called multi-component glasses such as $SiO_2$—$Al_2O_3$—$Li_2O$-based crystallized glass, can be used. In addition, a substrate other than glass made of silicon or metal and the like can also be used. An example of the metal substrate is an invar alloy (Fe—Ni-based alloy).

As was previously described, in the case of a mask blank substrate for EUV exposure, although a multicomponent glass material is used since the substrate is required to have low thermal expansion properties, there is a problem of it being difficult to obtain high smoothness in comparison with synthetic quartz glass used in transparent mask blank substrates. In order to solve this problem, a thin film composed of a metal, an alloy, or a material containing at least one of oxygen, nitrogen and carbon in either thereof, can be formed on a substrate composed of a multicomponent glass material. A surface having surface roughness within the aforementioned range can then be formed comparatively easily by mirror polishing and treating the surface of the thin film.

Preferred examples of the material of the aforementioned thin film include Ta (tantalum), alloys containing Ta and Ta compounds containing at least one of oxygen, nitrogen and carbon in either thereof. Examples of Ta compounds that can be used include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON and TaSiCON. Among these Ta compounds, TaN, TaON, TaCON, TaBN, TaBON, TaBCON, TaHfN, TaHfON, TaHfCON, TaSiN, TaSiON and TaSiCON that contain nitrogen (N) are more preferable. Furthermore, from the viewpoint of high smoothness of the thin film surface, the aforementioned thin film preferably has an amorphous structure. The crystal structure of the thin film can be measured with an X-ray diffraction analyzer (XRD).

In addition, the method of manufacturing a mask blank substrate of the present invention as previously described has a surface processing step for processing the surface so as to obtain surface morphology that has a prescribed PSD in the aforementioned prescribed spatial frequency region.

Although there are no particular limitations on the method used to carry out the surface processing step provided a prescribed PSD can be achieved in the aforementioned intermediate spatial frequency region (spatial frequency region of $1 \times 10^{-2}$ $\mu m^{-1}$ to 1 $\mu m^{-1}$) and high spatial frequency region (spatial frequency region of not less than 1 $\mu m^{-1}$), it is preferable to carry out an intermediate spatial frequency region roughness reducing step for reducing PSD in the intermediate spatial frequency region to the aforementioned range, and a high spatial frequency region roughness reducing step for reducing PSD in the high spatial frequency region to the aforementioned range.

Among these two steps, since the high spatial frequency region roughness reducing step typically requires a finer adjustment of roughness, and roughness of the high spatial frequency region may be affected by work in the intermediate spatial frequency region roughness reducing step while the opposite is hardly ever applicable, in the present invention, the high spatial frequency region roughness reducing step is preferably carried out after the intermediate spatial frequency region roughness reducing step.

These steps are preferably carried out by either of elastic emission machining (EEM) and/or catalyst-referred etching (CARE).

In particular, EEM is useful in the intermediate spatial frequency region roughness reducing step, while CARE is useful in the high spatial frequency region roughness reducing step.

<EEM>

EEM is a non-contact polishing method in which atoms on the surface of a processing target are removed in atomic units by allowing fine powder particles of not more than 0.1 $\mu m$ to contact the processing target (mask blank substrate) in a nearly no-load state and utilizing the interaction (a type of chemical bonding) that occurs at the interface between the fine powder particles and processing target at that time.

In order to allow the fine powder particles to make contact in the no-load state, the processing target is, for example, placed in water, the fine powder particles are allowed to disperse in the water, and a rotating body such as a wheel is placed in the vicinity of the processed surface of the processing target and rotated. As a result of this rotary motion, flow referred to as high-speed shear flow is generated between the processed surface and rotating body that enables the fine powder particles to act on the processed surface.

The size of the rotating body is suitably selected corresponding to the size of the processing target. The shape of the rotating body is suitably selected corresponding to the region desired to be preferentially contacted (reacted) with machining fluid on the surface of the processing target. In the case of desiring to preferentially have the machining fluid make contact topically, a spherical shape or linear shape is used, while in the case of desiring to preferentially have the machining fluid make contact over a comparatively wide area, a cylindrical shape is used.

The material of the rotating body is preferably resistant to machining fluid and has as low elasticity as possible. Highly elastic (comparatively soft) material is undesirable because the shape of the rotating body undergoes deformation during rotation causing the shape to become unstable and resulting in the possibility of worsening processing accuracy. Examples of the material of the rotating body include polyurethane, glass and ceramics.

Although the rotating speed of the rotating body is suitably selected according to the PSD desired to be achieved, it is normally 50 rpm to 1000 rpm, and the duration of polishing when using a rotating body is normally 60 minutes to 300 minutes.

In general, during EEM processing, the gap between the processing target and the rotating body can be adjusted by arranging the processing target perpendicular to the rotating body and applying a prescribed load to the rotated rotating body. The rotating body is scanned in parallel to the axis of rotation while applying a prescribed load to the rotated rotating body. Once the edge of the processing area has been reached, the rotating body is then moved in parallel to the rotating body by a prescribed distance followed by scanning in the opposite direction. The entire area can be processed by repeating this procedure. Although the range of the load is suitably selected according to the PSD desired to be achieved, it is normally set at within the range of 0.5 kg to 5 kg.

Although examples of the aforementioned fine powder particles used in EEM include cerium oxide, silica ($SiO_2$), colloidal silica, zirconium oxide, manganese dioxide and aluminum oxide, in the case the processing target is a glass substrate, zirconium oxide, aluminum oxide, colloidal silica and the like are preferably used for the fine powder particles. In addition, the average particle diameter of the fine powder particles is preferably not more than 100 nm (and average particle diameter is obtained by measuring an image at a magnification factor of 15 to $105 \times 10^3$ using a scanning electron microscope (SEM)). Furthermore, in order to improve processing speed, the fine powder particles may be suspended in a solvent in which the processing target is placed to obtain a machining fluid followed by contacting this with the processing target.

In EEM, water in which the fine powder particles have been dispersed as previously described and an aqueous solution in the form of an acidic aqueous solution or alkaline aqueous solution may be used for the machining fluid, or either of the aforementioned aqueous solutions may be used for the machining fluid.

Pure water or ultrapure water is preferable in the case of using water.

Examples of the acidic aqueous solution include aqueous solutions of sulfuric acid, hydrochloric acid, hydrofluoric acid and hydrofluorosilicic acid. Polishing speed is improved by containing an acidic aqueous solution in the machining fluid during non-contact polishing. However, since the glass substrate ends up being damaged depending on acid type or in the case the concentration of the acid is high, an acid and concentration thereof are suitably selected that do not damage the glass substrate.

Examples of the alkaline aqueous solution include aqueous solutions of potassium hydroxide and sodium hydroxide. Polishing speed is improved by containing an alkaline aqueous solution in the machining fluid during non-contact polishing. In addition, in the case ultrafine latent defects (such as cracks or scratches) are present on the surface of the glass substrate, since these can be made to be more conspicuous, fine defects can be more reliably detected in subsequent inspection steps. The alkaline aqueous solution is adjusted within a range that does not dissolve the polishing abrasive particles contained in the machining fluid, and is preferably adjusted so that the pH of the machining fluid is 9 to 12.

<Catalyst-Referred Etching (CARE)>

Next, the principle of CARE processing involves arranging a processing target (mask blank substrate) and catalyst in a treatment liquid or supplying a treatment liquid between the processing target and the catalyst, allowing the processing target and catalyst to make contact, and processing the processing target with the active species generated from molecules in the treatment liquid that have been adsorbed on the catalyst at that time. Furthermore, in the case the processing target is composed of a solid oxide such as glass, the processing principle involves using water for the treatment liquid, contacting the processing target and catalyst in the presence of water, and allowing the catalyst and surface of the processing target to undergo relative motion to enable decomposition products of hydrolysis to be removed from the surface of the processing target.

Specifically, the CARE processing method comprises processing a processing target by placing the processing target in a treatment liquid that does not dissolve the processing target in the normal state, arranging a processing reference surface of a surface plate having the reference surface, which surface is composed of a metal such as platinum, gold, iron or molybdenum, an alloy such as SUS or a ceramic solid catalyst in contact with or in extremely close proximity to the processed surface of the processing target (or supplying a treatment liquid between the processing target and the catalyst), and allowing the processing target and the processing reference surface to undergo relative motion in the treatment liquid so that the processing target reacts with active species formed on the surface of the processing reference surface. Furthermore, in the case the material of the processing target is not dissolved in the normal state by a treatment liquid in which halogen-containing molecules are dissolved therein, a treatment liquid in which halogen-containing molecules are dissolved therein can also be used. Here, although hydrogen halides are preferable for the halogen-containing molecules, molecules containing a C—F, S—F, N—F, C—Cl, S—Cl or N—Cl bond can also be used.

Here, an aqueous solution in which hydrogen halide molecules are dissolved is referred to as a hydrohalogenic acid. Although examples of halogens include fluorine (F), chlorine (Cl), bromine (Br) and iodine (I), since chemical reactivity decreases as atomic number becomes higher, considering actual processing rate when used as a treatment liquid, hydrofluoric acid (HF aqueous solution) can be used preferably. However, an HF aqueous solution ends up dissolving glass ($SiO_2$), while an HCl aqueous solution selectively elutes Ti contained in low thermal expansion glass. A hydrohalogenic acid is preferably used after adjusting to a suitable concentration in consideration of these factors and processing time.

A metal such as platinum, gold, iron or molybdenum, an alloy such as SUS, or a ceramic solid catalyst, which promotes a reaction that extracts hydrogen ions and atoms by oxidizing hydrogen, is used for the catalyst. Since active species are generated only on the processing reference surface and these active species immediately lose activity after leaving the processing reference surface, side reaction rarely occurs and the principle of surface processing is not a mechanical polishing but a chemical reaction, damage to the processing target is extremely low, superior smoothness can be achieved, and roughness in a high spatial frequency region can be effectively reduced.

Moreover, in the case the mask blank substrate is a glass substrate and a transition metal such as platinum, gold, silver, copper, molybdenum, nickel or chromium is used as a solid catalyst, the surface of the substrate can be processed by carrying out CARE in water, although the mechanism thereof has not been determined (it is thought by the inventors of the present invention that a hydrolysis reaction likely proceeds), and CARE is preferably carried out in this manner from the viewpoints of cost and processing properties.

The processing reference surface composed of a solid catalyst on a surface plate as previously explained is normally formed by depositing a solid catalyst on a prescribed pad. There are no particular limitations on the pad, and those made of rubber, transparent resin, foamable resin or nonwoven fabric can be used.

As has been previously described, CARE comprises carrying out surface processing by allowing a processing target and the processing reference surface to undergo relative motion in a treatment liquid, and removing the surface of the processing target by reacting the processing target with an active species generated on the surface of the processing reference surface.

In addition, CARE processing conditions can be set to, for example, a range of 5 rpm to 200 rpm for the rotating speed of the surface plate, 5 rpm to 200 rpm for the rotating speed of the processing target, 10 hPa to 1000 hPa for the processing pressure, and 5 minutes to 120 minutes for the processing time.

A typical CARE processing apparatus for carrying out CARE in the manner explained above is shown in FIG. 7. This CARE processing apparatus 100 has a treatment tank 124, a catalyst surface plate 126 arranged to rotate freely in the treatment tank 124, and a substrate holder 130 that removably holds a processing target 128 (mask blank substrate) with the surface (processed surface) facing downward. The substrate holder 130 is coupled to the end of a vertically movable rotating shaft 132 provided at a location parallel and eccentric to the center of the axis of rotation of the catalyst surface plate 126. The catalyst surface plate 126 has, for example, a platinum solid catalyst 142 of a prescribed thickness formed on the surface of base 140 made of a rigid material composed of, for example, stainless steel. Furthermore, although the solid catalyst may be used in bulk, it may also employ a configuration in which the platinum 142 is formed on an elastic base material such as fluorine rubber that is inexpensive and has good shape stability.

In addition, a temperature control mechanism in the form of a heater 170 for controlling the temperature of the processing target 128 held in the holder 130 is embedded within the substrate holder 130, extending into the rotating shaft 132. A treatment liquid supply nozzle 174, which supplies the inside of the treatment tank 124 with treatment liquid (such as pure water) controlled to a prescribed temperature by a temperature control mechanism in the form of a heat exchanger 172, is arranged above the treatment tank 124. Moreover, a temperature control mechanism in the form of a liquid flow path 176 that controls the temperature of the catalyst surface plate 126 is provided within the catalyst surface plate 126.

An example of a method by which CARE is carried out by this CARE processing apparatus 100 is as follows. Treatment liquid is supplied to the catalyst surface plate 126 from the treatment liquid supply nozzle 174. The processing target 128 held in the substrate holder 130 is pressed against the surface of the platinum (catalyst) 142 of the catalyst surface plate 126 at a prescribed pressure, the catalyst surface plate 126 and the processing target 128 are rotated while causing treatment liquid to be interposed in the contact area (processing area) between the processing target 128 and the platinum (catalyst) 142 of the catalyst surface plate 126, and the surface (lower surface) of the processing target 128 is subjected to removal processing (etching) to form a flat surface. Furthermore, the processing target 128 held in the substrate holder 130 may also be brought into extremely close proximity to the platinum (catalyst) 142 followed by removal processing (etching) of the surface of the processing target 128 to a flat surface without pressing the processing target 128 held in the substrate holder 130 against the platinum (catalyst) 142 of the catalyst surface plate 126 at a prescribed pressure.

As a result of carrying out each of the steps explained above, the mask blank substrate of the present invention is manufactured by adjusting PSD values in an intermediate spatial frequency region and high spatial frequency region to not more than prescribed values. In the present invention, other steps carried out in the manufacturing process of mask blank substrates may also be carried out.

[Substrate with Multilayer Reflective Film]

Next, an explanation is provided of a substrate with a multilayer reflective film 20 according to one embodiment of the present invention below. FIG. 2 is a cross-sectional schematic diagram showing the substrate with a multilayer reflective film 20 of the present embodiment.

The substrate with a multilayer reflective film 20 of the present embodiment has a structure having a multilayer reflective film 21 on a main surface of the previously explained mask blank substrate 10 on the side of which a transfer pattern is formed. This multilayer reflective film 21 imparts a function of reflecting EUV light to a reflective mask for EUV lithography, and adopts a configuration of a multilayer film obtained by periodically laminating elements having different refractive indices.

Although there are no particular limitations on the material of the multilayer reflective film 21 provided it reflects EUV light, the reflectance thereof when present alone is normally not less than 65% and the upper limit thereof is normally 73%. This type of multilayer reflective film 21 can typically employ a configuration in which a thin film composed of a high refractive index material (high refractive index layer) and a thin film composed of a low refractive index material (low refractive index layer) are alternately laminated for about 40 to 60 cycles.

For example, the multilayer reflective film 21 for EUV light of a wavelength of 13 nm to 14 nm preferably is an Mo/Si cyclically periodic laminate film obtained by alternately laminating about 40 cycles of an Mo film and Si film. In addition, a multilayer reflective film used in the region of EUV light can be, for example, an Ru/Si cyclically periodic multilayer film, Mo/Be periodic multilayer film, Mo compound/Si compound periodic multilayer film, Si/Nb periodic multilayer film, Si/Mo/Ru periodic multilayer film, Si/Mo/Ru/Mo periodic multilayer film or Si/Ru/Mo/Ru periodic multilayer film.

Although the method used to form the multilayer reflective film 21 is known in the art, it can be formed by depositing each layer by, for example, magnetron sputtering or ion beam sputtering. In the case of the aforementioned Mo/Si periodic multilayer film, for example, an Si film having a thickness of about several nm is first deposited on the substrate 10 using an Si target by, ion beam sputtering, followed by depositing an Mo film having a thickness of about several nm using an Mo target. The multilayer reflective film 21 is formed by repeating this cycle for 40 to 60 times.

A protective film 22 (see FIG. 3) can also be formed on the multilayer reflective film 21 formed in the manner described above in order to protect the multilayer reflective film 21 from dry etching and wet cleaning in a process of manufacturing a reflective mask for EUV lithography. In this manner, a form having the multilayer reflective film 21 and the protective film 22 on the mask blank substrate 10 can also be used as a substrate with a multilayer reflective film in the present invention.

In addition, although examples of materials that can be used for the aforementioned protective film 22 include materials such as Ru, Ru—(Nb,Zr,Y,B,Ti,La,Mo), Si—(Ru, Rh,Cr,B), Si, Zr, Nb, La and B, among these, the application of a material comprising ruthenium (Ru) results in more favorable reflectance properties of the multilayer reflective film. Specifically, the material is preferably Ru, Ru—(Nb, Zr,Y,B,Ti,La,Mo). This type of protective film is particularly effective in the case of using a Ta-based material for the absorber film described later and patterning the absorber film by dry etching with a Cl-based gas.

In addition, in the aforementioned substrate with a multilayer reflective film 20, the surface of the multilayer reflective film 21 or the protective film 22 (namely, the surface of the substrate with a multilayer reflective film 20)

is such that the power spectral density at a spatial frequency of $1\times10^{-2}$ μm$^{-1}$ to 1 μm$^{-1}$, obtained by measuring a 0.14 mm×0.1 mm region at 640×480 pixels with a white-light interferometer, is preferably not more than $4\times10^{7}$ nm$^{4}$, and the power spectral density at a spatial frequency of 1 μm$^{-1}$ to 100 μm$^{-1}$, obtained by measuring a 1 μm×1 μm region with an atomic force microscope, is preferably not more than 20 nm$^{4}$. More preferably, the power spectral density at a spatial frequency of $1\times10^{-2}$ μm$^{-1}$ to 1 μm$^{-1}$, obtained by measuring a 0.14 mm×0.1 mm region at 640×480 pixels with a white-light interferometer, is $1\times10^{2}$ nm$^{4}$ to $3.5\times10^{7}$ nm$^{4}$, and the power spectral density at a spatial frequency of 1 μm$^{-1}$ to 100 μm$^{-1}$, obtained by measuring a 1 μm×1 μm region with an atomic force microscope, is 0.5 nm$^{4}$ to 16 nm$^{4}$. Even more preferably, the power spectral density at a spatial frequency of $1\times10^{-2}$ μm$^{-1}$ to 1 μm$^{-1}$, obtained by measuring a 0.14 mm×0.1 mm region at 640×480 pixels with a white-light interferometer, is $2\times10^{2}$ nm$^{4}$ to $3\times10^{7}$ nm$^{4}$, and the power spectral density at a spatial frequency of 1 μm$^{-1}$ to 100 μm$^{-1}$, obtained by measuring a 1 μm×1 μm region with an atomic force microscope, is 1 nm$^{4}$ to 15 nm$^{4}$.

As a result of configuring in this manner, decreases in pattern contrast attributable to flare during pattern transfer can be inhibited, and in the case of inspecting for defects in the substrate with a multilayer reflective film 20 with a highly sensitive defect inspection apparatus that uses a 266 nm UV laser or 193 nm ArF excimer laser, which are within the previously exemplified wavelength range of 150 nm to 365 nm, for the inspection light source, the number of detected defects, including pseudo defects, can be reduced considerably. In addition, when inspecting for defects on the surface of the substrate with a multilayer reflective film 20 with a highly sensitive defect inspection apparatus that uses 13.5 nm EUV light, since scattering from the multilayer reflective film can be inhibited, defect inspections can be reliably carried out under highly sensitive inspection conditions (such as inspection sensitivity conditions enabling detection of defects of a size of 15 nm in terms of SEVD).

As was previously described, since the mask blank substrate of the present invention has an adequately inhibited roughness (PSD) in the intermediate spatial frequency region and high spatial frequency region and has extremely superior smoothness, the PSD of a multilayer reflective film formed thereon (or a protective film further formed thereon) in the intermediate spatial frequency region and high spatial frequency region are easily made to be within a range that enables the number of detected defects, including pseudo defects, to be reduced considerably as described above. Since defect inspections can be reliably carried out under such highly sensitive inspection conditions like this, the mask blank substrate of the present invention is useful as a mask blank substrate for EUV lithography that requires such highly sensitive inspections in its manufacturing stage.

In addition, in the aforementioned substrate with a multilayer reflective film 20, the surface of the multilayer reflective film 21 or the protective film 22 is such that the power spectral density at a spatial frequency of $10^{-1}$ μm$^{-1}$ to 100 μm$^{-1}$, obtained by measuring a 1 μm×1 μm region with an atomic force microscope, is preferably not more than 7.5 nm$^{4}$, and more preferably, the power spectral density at a spatial frequency of $10^{-1}$ μm$^{-1}$ to 100 μm$^{-1}$, obtained by measuring a 1 μm×1 μm region with an atomic force microscope, is not more than 6.5 nm$^{4}$. Even more preferably, the power spectral density at a spatial frequency of $10^{-1}$ μm$^{-1}$ to 100 μm$^{-1}$, obtained by measuring a 1 μm×1 μm region with an atomic force microscope, is not more than 5 nm$^{4}$, and particularly preferably, the power spectral density at a spatial frequency of $10^{-1}$ μm$^{-1}$ to 100 μm$^{-1}$, obtained by measuring a 1 μm×1 μm region with an atomic force microscope, is 0.5 nm$^{4}$ to 5 nm$^{4}$. As a result of adopting such a configuration, in the case of carrying out a defect inspection on a substrate with a multilayer reflective film with a highly sensitive defect inspection apparatus that uses 13.5 nm EUV light for the inspection light source wavelength, the number of detected defects, including pseudo defects, can be reduced considerably.

In order to maintain the surface morphology of the substrate 10 within the aforementioned ranges and allow the surface of the multilayer reflective film 21 or the protective film 22 to have a power spectral density within the aforementioned ranges, the multilayer reflective film 21 is deposited by sputtering so that a high refractive index layer and a low refractive index layer accumulate at a prescribed incident angle relative to the normal of a main surface of the substrate 10.

Specifically, the multilayer reflective film 21 is preferably formed by depositing sputtered particles of a high refractive index material and a low refractive index material by allowing them to alternately enter at an incident angle of 0 degree to 30 degrees relative to the normal of the main surface of the substrate 10 by ion beam sputtering using targets of the high refractive index material and low refractive index material. As a result, a substrate with a multilayer reflective film can be efficiently manufactured that has a multilayer reflective film having superior EUV light reflective properties, since not only the number of detected defects, including pseudo defects, can be reduced considerably in the case of carrying out a defect inspection on the substrate with a multilayer reflective film with a highly sensitive defect inspection apparatus, but also the surface of the multilayer reflective film 21 or the protective film 22 has superior smoothness.

Moreover, after depositing the multilayer reflective film 21, the protective film 22 formed on the multilayer reflective film 21 is also preferably subsequently formed by ion beam sputtering so that the protective film 22 accumulates at diagonal angle relative to the normal of the main surface of the mask blank substrate 10.

Furthermore, in the substrate with a multilayer reflective film 20, a back side electrically conductive film 23 (see FIG. 3) can also be formed on the side of the mask blank substrate 10 on the opposite side from side contacting the multilayer reflective film 21 for the purpose of serving as an electrostatic chuck. Such form having the multilayer reflective film 21 and the protective film 22 on the side of which a transfer pattern is formed, and having a back side electrically conductive film 23 on the side opposite from the side contacting the multilayer reflective film 21, is also included in the substrate with a multilayer reflective film in the present invention. Furthermore, the electrical property (sheet resistance) required for the back side electrically conductive film 23 is normally not more than 100Ω/□. The method used to form the back side electrically conductive film 23 is known, and the film can be formed, for example, using a metal or alloy target of Cr or Ta and the like by magnetron sputtering or ion beam sputtering.

Furthermore, although the back side electrically conductive film 23 was explained in the aforementioned explanation as being formed on the back side opposite from the aforementioned main surface after having deposited the multilayer reflective film 21 and the protective film 22 on the main surface of the mask blank substrate 10 on the side of which a transfer pattern is formed, the present invention is not limited thereto. The substrate with a multilayer reflective film 20 may also be manufactured by forming the back side electrically conductive film 23 on the main surface opposite from the main surface of the mask substrate 10 on the side of which a transfer pattern is formed, followed by depositing the multilayer reflective film 21 and then the protective film 22 on the main surface on the side of which the transfer pattern is formed.

In addition, the substrate with a multilayer reflective film 20 of the present embodiment may also have a base layer formed between the mask blank substrate 10 and the multilayer reflective film 21. The base layer can be formed for the purpose of improving smoothness of the main surface of the substrate 10, for the purpose of reducing defects, for the purpose of the effect of enhancing reflectance of the multilayer reflective film 21, and for the purpose of compensating for stress in the multilayer reflective film 21.

[Reflective Mask Blank]

Figure 3:
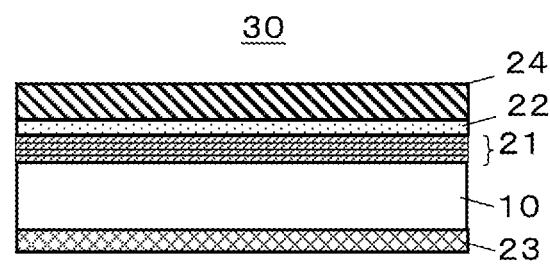
FIG. 3 is a cross-sectional schematic diagram showing one example of the configuration of a reflective mask blank according to one embodiment of the present invention.

Next, an explanation is provided of a reflective mask blank 30 according to one embodiment of the present invention below. FIG. 3 is a cross-sectional schematic diagram showing the reflective mask blank 30 of the present embodiment.

The reflective mask blank 30 of the present embodiment employs a configuration in which an absorber film 24 serving as a transfer pattern is formed on the protective film 22 of the previously explained substrate with a multilayer reflective film 20 (or on the multilayer reflective film 21 in the case the protective film 22 is not present).

There are no particular limitations on the material of the aforementioned absorber film 24. For example, a material having the function of absorbing EUV light that is composed of Ta (tantalum) alone or having Ta as the main component thereof is used preferably. A material having Ta as the main component thereof is normally a Ta alloy. The crystalline state of this absorber film is such that it preferably has an amorphous or microcrystalline structure from the viewpoints of smoothness and flatness. Examples of materials that can be used for the material having Ta as the main component thereof include materials containing Ta and B, materials containing Ta and N, materials containing Ta and B and further containing at least O or N, materials containing Ta and Si, materials containing Ta, Si and N, materials containing Ta and Ge, and materials containing Ta, Ge and N. In addition, an amorphous structure is easily obtained by adding, for example, B, Si or Ge and the like to Ta, thereby making it possible to improve smoothness of the absorber film 24. Moreover, if N or O is added to Ta, resistance to oxidation improves, thereby making it possible to improve stability over time.

In the case of carrying out a defect inspection in the same manner as the aforementioned substrate with a multilayer reflective film 20 on the reflective mask blank 30 having the absorber film 24 formed thereon, the surface of the absorber film 24 is such that power spectral density is preferably within the aforementioned ranges (namely, not more than $4 \times 10^7$ nm$^4$ in the intermediate spatial frequency region and not more than 20 nm$^4$ in the high spatial frequency region) from the viewpoint of reducing the number of detected defects, including pseudo defects. The absorber film 24 preferably has an amorphous structure so as to maintain the aforementioned PSD ranges regarding the mask blank substrate 10 and the surface morphology of the substrate with a multilayer reflective film 20 and to allow the surface of the absorber film 24 to have power spectral density within the aforementioned ranges. Crystal structure can be confirmed with an X-ray diffraction analyzer (XRD).

Furthermore, the surface of the aforementioned absorber film 24 is such that power spectral density at a spatial frequency of 1 μm$^{-1}$ to 10 μm$^{-1}$, obtained by measuring a 1 μm×1 μm region with an atomic force microscope, is preferably not more than 20 nm$^4$, and more preferably, power spectral density at a spatial frequency of 1 μm$^{-1}$ to 10 μm$^{-1}$, obtained by measuring a 1 μm×1 μm region with an atomic force microscope, is 1 nm$^4$ to 15 nm$^4$. As a result of employing such a configuration, in the case of detecting defects on the reflective mask blank 30 with a highly sensitive defect inspection apparatus that uses a 266 nm UV laser or 193 nm ArF excimer laser, which are within the previously exemplified wavelength range of 150 nm to 365 nm, for the inspection light source, the number of detected defects, including pseudo defects, can be reduced considerably.

As was previously described, since roughness (PSD) of the mask blank substrate 10 of the present invention in the intermediate spatial frequency region and high spatial frequency region is adequately inhibited and since it has extremely superior smoothness, PSD in the intermediate spatial frequency region and high spatial frequency region of the multilayer reflective film 21 formed thereon (or the protective film 22 further formed thereon) are also easily made to be within a range that enables the number of detected defects, including pseudo defects, to be reduced considerably as described above. Moreover, as a result thereof, PSD in the intermediate spatial frequency region and high spatial frequency region of the absorber film 24 formed on the multilayer reflective film 21 (or the protective film 22) is also easily made to be within a range that enables the number of detected defects, including pseudo defects, to be reduced considerably as described above.

In addition, the surface of the aforementioned absorber film 24 is such that power spectral density at a spatial frequency of 10 μm$^{-1}$ to 100 μm$^{-1}$, obtained by measuring a 1 μm×1 μm region with an atomic force microscope, is preferably not more than 5 nm$^4$, and more preferably, power spectral density at a spatial frequency of 10 μm$^{-1}$ to 100 μm$^{-1}$, obtained by measuring a 1 μm×1 μm region with an atomic force microscope, is 0.5 nm$^4$ to 5 nm$^4$. As a result of employing such a configuration, in the case of detecting defects on the reflective mask blank 30 with a highly sensitive defect inspection apparatus that uses 13.5 nm EUV light for the inspection light source wavelength, the number of detected defects, including pseudo defects, can be reduced considerably.

Furthermore, the reflective mask blank of the present invention is not limited to the configuration shown in FIG. 3. For example, a resist film to serve as a mask for patterning the aforementioned absorber film 24 can also be formed on the absorber film 24, and this reflective mask with resist film is also a reflective mask blank of the present invention. Furthermore, the resist film formed on the absorber film 24 may be a positive resist or negative resist. In addition, the resist film may also be for electron beam drawing or laser drawing. Moreover, a so-called hard mask (etching mask) film can also be formed between the absorber film 24 and the resist film, and this embodiment is also a reflective mask blank of the present invention.

[Reflective Mask]

Figure 4:
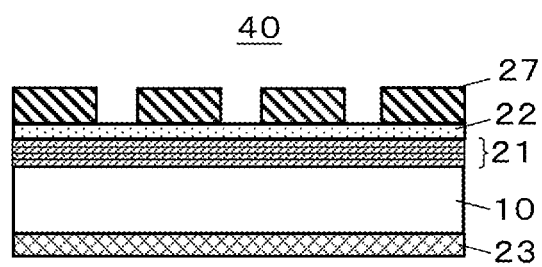
FIG. 4 is a cross-sectional schematic diagram showing one example of a reflective mask according to one embodiment of the present invention.

Next, an explanation is provided of a reflective mask 40 according to one embodiment of the present invention. FIG. 4 is a schematic diagram showing the reflective mask 40 of the present embodiment.

The reflective mask 40 of the present embodiment employs a configuration in which the absorber film 24 in the aforementioned reflective mask blank 30 is patterned to form an absorber pattern 27 on the aforementioned protective film 22 or multilayer reflective film 21. The reflective mask 40 of the present embodiment can be used as a reflective mask 40 for lithography as a result of the portion where the absorber film 24 is present on the mask surface absorbing exposure light when exposed to exposure light such as EUV light, and other portions where the absorber film 24 has been removed reflecting exposure light at the exposed protective film 22 and multilayer reflective film 21.

[Method of Manufacturing Semiconductor Device]

A semiconductor device, having various wiring and other patterns formed on a semiconductor substrate, can be manufactured by transferring a transfer pattern, such as a circuit pattern, based on the absorber pattern 27 of the reflective mask 40, to a resist film formed on a workpiece such as a semiconductor substrate by using the previously explained reflective mask 40 and a lithography process using an exposure apparatus, followed by going through various other steps.

Furthermore, fiducial marks can be formed on the previously described mask blank substrate 10, substrate with a multilayer reflective film 20 and reflective mask blank 30, and the coordinates of these fiducial marks and the locations of critical defects detected with a highly sensitive defect inspection apparatus as previously described can be controlled. When fabricating the reflective mask 40 based on the resulting critical defect location information (defect data), drawing data can be corrected and defects can be reduced so that the absorber pattern 27 is formed at those locations where critical defects are present based on the aforementioned defect data and transferred pattern (circuit pattern) data.

EXAMPLES

Example 1

Fabrication of Mask Blank Substrate (Surface Processing by Polishing and MRF)

An $SiO_2$—$TiO_2$-based glass substrate having a size of 152.4 mm×152.4 mm and a thickness of 6.35 mm was prepared for use as a mask blank substrate, and the front and back surfaces of the glass substrate were sequentially polished with cerium oxide abrasive particles and colloidal silica abrasive particles using a double-sided polishing apparatus followed by treating the surfaces with a low concentration of hydrofluorosilicic acid. Measurement of the surface roughness of the resulting glass substrate surface with an atomic force microscope yielded a root mean square roughness (Rms) of 0.15 nm.

The surface morphology (surface form, flatness) and TTV (Total Thickness Variation) of regions of 148 mm×148 mm on the front and back surfaces of the glass substrate was measured with a wavelength-shifting interferometer using a wavelength-modulating laser. As a result, the flatness of the front and back surfaces of the glass substrate was 290 nm (convex shape). The results of measuring the surface morphology (flatness) of the glass substrate surface were stored in a computer in the form of height information with respect to a reference surface for each measurement point, compared with a reference value of 50 nm (convex shape) for the flatness of the front surface and a reference value of 50 nm for the flatness of the back side required for glass substrates, and the differences therewith (required removal amounts) were calculated by the computer.

Next, processing conditions for topical surface processing were set corresponding to the required removal amounts for each processing spot-shaped region on the surface of the glass substrate. A spot on a dummy substrate was preliminarily processed in the same manner as actual processing without moving the substrate for a fixed period of time, the morphology thereof was measured with the same measuring instrument as the apparatus used to measure the surface morphology of the aforementioned front and back surfaces, and the processing volume of the spot was measured per unit time. The scanning speed during Raster scanning of the glass substrate was then determined in accordance with the required removal amount obtained from the spot information and surface morphology information of the glass substrate.

Surface morphology was adjusted by carrying out topical surface processing treatment in accordance with the set processing conditions by magnetorheological finishing (MRF) using a substrate finishing apparatus employing a magnetorheological fluid so that the flatness of the front and back surfaces of the glass substrate was not more than the aforementioned reference values. Furthermore, the magnetorheological fluid used at this time contained an iron component, and the polishing slurry was composed of an alkaline aqueous solution and an abrasive (about 2% by weight) and used cerium oxide for the abrasive. Subsequently, the glass substrate was immersed in a cleaning tank containing an aqueous hydrochloric acid solution having a concentration of about 10% (temperature: about 25° C.) for about 10 minutes followed by rinsing with pure water and drying with isopropyl alcohol (IPA).

When the surface morphology (surface form, flatness) of the resulting glass substrate surface was measured, the flatness of the front and back surfaces was about 40 nm to 50 nm. In addition, when a 1 μm×1 μm region in the center of the main surface of the glass substrate (142 mm×142 mm) on the side of which a transfer pattern is formed was measured using an atomic force microscope, the surface roughness of the glass substrate surface was such that the root mean square roughness (Rms) was 0.37 nm, indicating a rougher state than the surface roughness prior to topical surface processing by MRF.

A power spectral analysis was carried out by measuring the surface morphology of this glass substrate with the NewView 6300 White-Light Interferometer Non-Contact Surface Morphology Analyzer manufactured by Zygo Corp. (measured region: 0.14 mm×0.1 mm, no. of pixels: 640× 480). The results are shown in FIG. 5 (unprocessed).

Figure 5:
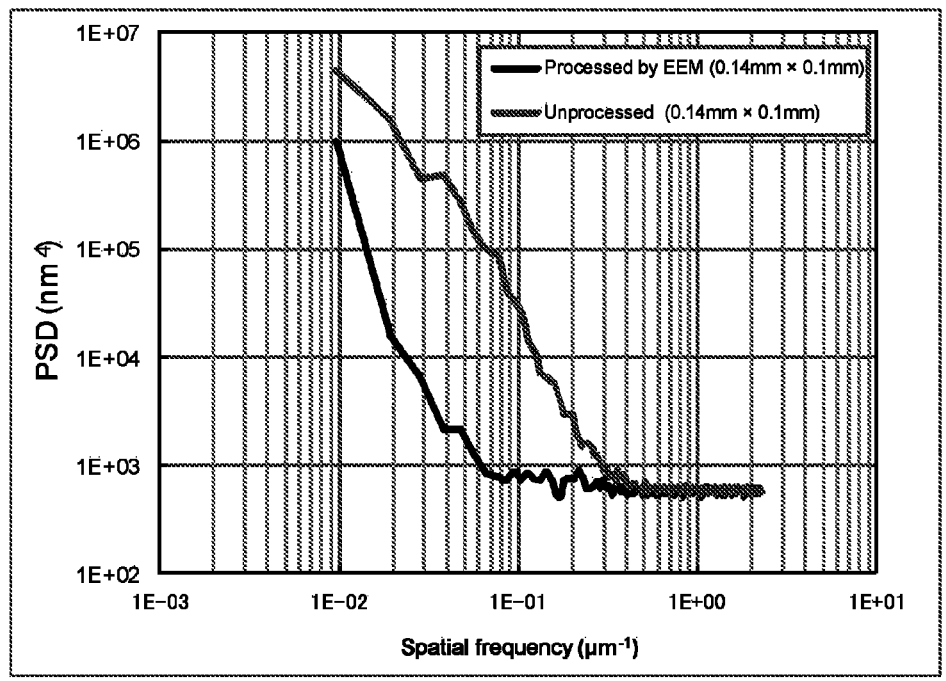
FIG. 5 is a graph indicating the results of measuring power spectral density in 0.14 mm×0.1 mm regions on the main surfaces of a glass substrate subjected to EEM processing and an unprocessed glass substrate at 640×480 pixels with a white-light interferometer in Example 1.

In FIG. 5, "Unprocessed" refers to data obtained by observing a 0.14 mm×0.1 mm region at 640×480 pixels. "Processed by EEM" will be subsequently described.

As a result of the power spectral analysis, power spectral density at a spatial frequency of $1 \times 10^{-2}$ μm$^{-1}$ to 1 μm$^{-1}$ was $4.5 \times 10^6$ nm$^4$ at its maximum point (spatial frequency: $1 \times 10^{-2}$ μm$^{-1}$) (refer to the gray line in FIG. 5).

Figure 6:
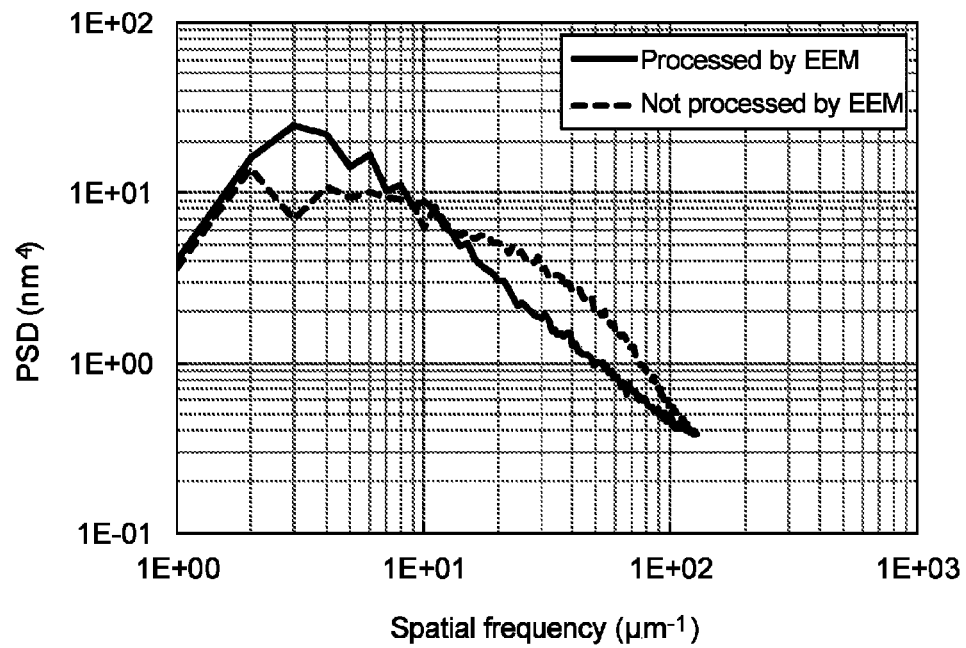
FIG. 6 is a graph indicating the results of measuring power spectral density in 1 µm×1 µm regions of a glass substrate subjected to EEM processing and an unprocessed glass substrate with an atomic force microscope in Example 1.

In addition, the results of analyzing power spectrum by measuring the surface roughness (measured region: 1 μm×1 μm) of the aforementioned glass substrate with an atomic force microscope are indicated in FIG. 6 as "Not processed by EEM". As a result of this analysis, power spectral density at a spatial frequency of 1 μm$^{-1}$ to 100 μm$^{-1}$ was 14 nm$^4$ at its maximum point (spatial frequency: 2 μm$^{-1}$). More specifically, the power spectral density at a spatial frequency of 1 μm$^{-1}$ to 10 μm$^{-1}$ was 14 nm$^4$ at its maximum point (spatial frequency: 2 μm$^{-1}$), and power spectral density at a spatial frequency of 10 μm$^{-1}$ to 100 μm$^{-1}$ was 8.32 nm$^4$ at its maximum point (spatial frequency: 11 μm$^{-1}$)(refer to broken line in FIG. 6).

(Surface Processing by EEM)

Next, EEM was carried out on the front and back surfaces of the glass substrate that had undergone power spectral analysis as described above for the purpose of maintaining or improving the surface morphology of the glass substrate surfaces and for the purpose of reducing roughness in the intermediate spatial frequency region. This EEM was carried out under the processing conditions indicated below.

Machining fluid: Neutral aqueous solution (pH of 7) containing fine powder particles (concentration: 3% by weight)

Fine powder particles: Colloidal silica, average particle diameter: about 80 nm

Rotating body: Polyurethane rotating sphere
   Rotating body rotating speed: 280 rpm
   Polishing time: 120 minutes
   Load: 1.5 kg Subsequently, the edge faces of the glass substrate were scrubbed followed by megasonic cleaning of the front and back surfaces with low concentration aqueous hydrofluoric acid solution (frequency: 3 MHz, 60 seconds), rinsing with pure water and drying.

Power spectral analysis was carried out by measuring the surface morphology of the glass substrate that had undergone surface processing by EEM with the NewView 6300 White-Light Interferometer Non-Contact Surface Morphology Analyzer manufactured by Zygo Corp. (measured region: 0.14 mm×0.1 mm, no. of pixels: 640×480) in the same manner as described above. The results are shown in FIG. 5 indicated as "Processed by EEM".

As a result of analysis, power spectral density at a spatial frequency of $1 \times 10^{-2}$ $\mu m^{-1}$ to 1 $\mu m^{-1}$ was $10^6$ $nm^4$ at its maximum point (spatial frequency: $1 \times 10^{-2}$ $\mu m^{-1}$). On the basis of the above, it was found that it is possible to reduce roughness in the intermediate spatial frequency region ($1 \times 10^{-2}$ $\mu m^{-1}$ to 1 $\mu m^{-1}$) by surface processing via EEM.

In addition, the results of carrying out power spectral analysis by measuring the surface status of the glass substrate obtained by undergoing surface processing by EEM with an atomic force microscope (measured region: 1 $\mu m \times 1$ $\mu m$) are shown in FIG. 6 indicated as "Processed by EEM".

As a result of analysis, power spectral density at a spatial frequency of 1 $\mu m^{-1}$ to 100 $\mu m^{-1}$ was 25 $nm^4$ at its maximum point (spatial frequency: 3 $\mu m^{-1}$) (see solid line in FIG. 6). More specifically, the power spectral density at a spatial frequency of 1 $\mu m^{-1}$ to 10 $\mu m^{-1}$ was 25 $nm^4$ at its maximum point (spatial frequency: 3 $\mu m^{-1}$), and power spectral density at a spatial frequency of 10 $\mu m^{-1}$ to 100 $\mu m^{-1}$ was 9.0 $nm^4$ at its maximum point (spatial frequency: 10 $\mu m^{-1}$). On the basis of the above, it can be understood from FIG. 6 that PSD in the high spatial frequency was not subjected to large changes by surface processing by EEM.

(Surface Processing by CARE)

Figure 7:
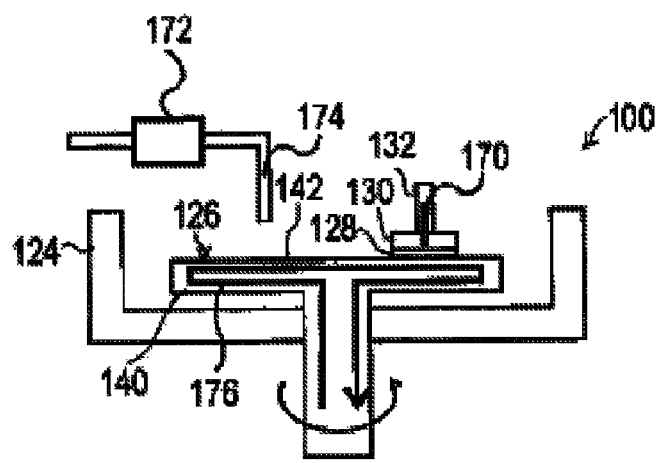
FIG. 7 is a schematic diagram of a typical CARE processing apparatus.

Next, surface processing by catalyst-referred etching (CARE) was carried out on the front and back surfaces of the glass substrate that had undergone EEM surface processing as described above for the purpose of reducing roughness in the high spatial frequency region. A schematic diagram of used CARE processing apparatus is shown in FIG. 7. Furthermore, the processing conditions were as indicated below.

Machining fluid: Pure water
   Catalyst: Pt
   Substrate rotating speed: 10.3 rpm
   Catalyst surface plate rotating speed: 10 rpm
   Processing time: 50 minutes
   Processing pressure: 250 hPa Subsequently, after scrubbing the edge faces of the glass substrate, the substrate was immersed in a cleaning tank containing aqua regia (temperature: about 65° C.) followed by rinsing with pure water and drying. Furthermore, cleaning with aqua regia was carried out several times until there was no longer any Pt catalyst residue on the front and back surfaces of the glass substrate.

Surface status of the glass substrate that had undergone surface processing by CARE was analyzed by power spectral analysis by measuring with the NewView 6300 White-Light Interferometer Non-Contact Surface Morphology Analyzer manufactured by Zygo Corp. (measured region: 0.14 mm×0.1 mm, no. of pixels: 640×480).

As a result of power spectral analysis, power spectral density at a spatial frequency of $1 \times 10^{-2}$ $\mu m^{-1}$ to 1 $\mu m^{-1}$ was $5 \times 10^5$ $nm^4$ at its maximum point (spatial frequency: $1 \times 10^{-2}$ $\mu m^{-1}$). Namely, there was hardly any change in roughness in the intermediate spatial frequency region by surface processing by CARE.

Figure 8:
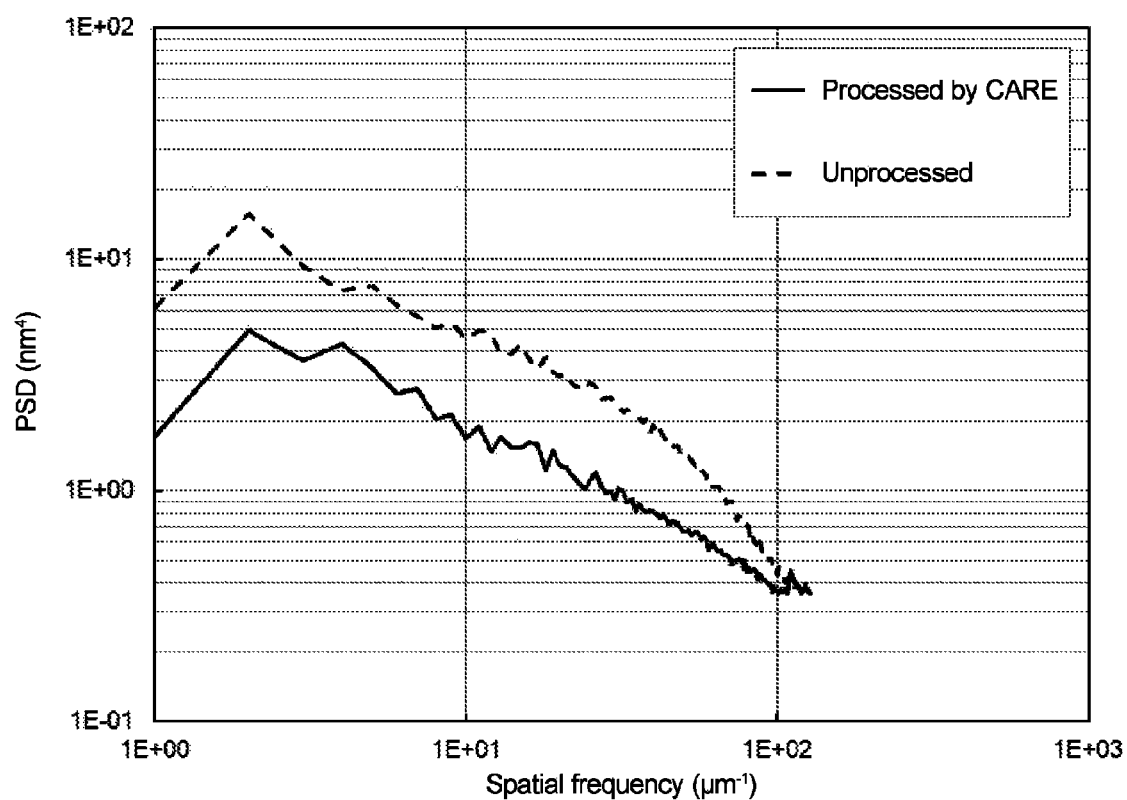
FIG. 8 is a graph indicating the results of measuring power spectral density with an atomic force microscope for a 1 µm×1 µm region of a mask blank substrate that had undergone EEM processing and CARE processing in Example 1, and the results of measuring power spectral density with an atomic force microscope for a 1 µm×1 µm region of a mask blank substrate that had undergone MRF-double-sided touch polishing in Comparative Example 1.

In addition, the results of carrying out a power spectral analysis by measuring surface status of the glass substrate with an atomic force microscope (measured region: 1 $\mu m \times 1$ $\mu m$) are shown in FIG. 8 (solid line indicated with "Processed by CARE"). As a result of the analysis, the power spectral density at a spatial frequency of 1 $\mu m^{-1}$ to 100 $\mu m^{-1}$ was 5.0 $nm^4$ at its maximum point (spatial frequency: 2 $\mu m^{-1}$). More specifically, power spectral density at a spatial frequency of 1 $\mu m^{-1}$ to 10 $\mu m^{-1}$ was 5.0 $nm^4$ at its maximum point (spatial frequency: 2 $\mu m^{-1}$), and power spectral density at a spatial frequency of 10 $\mu m^{-1}$ to 100 $\mu m^{-1}$ was 1.9 $nm^4$ at its maximum point (spatial frequency: 11 $\mu m^{-1}$).

On the basis of these results, surface processing by CARE was able to reduce roughness in the high spatial frequency region. In addition, root mean square roughness (Rms) was favorable at 0.08 nm.

<Defect Inspection>

A 132 mm×132 mm region on a main surface of a mask blank substrate manufactured after going through surface processing treatment by EEM and CARE as described above was inspected for defects using a highly sensitive defect inspection apparatus having an inspection light source wavelength of 193 nm (Teron 600 Series manufactured by KLA-Tencor Corp.). Inspection sensitivity conditions were set to allow detection of defects having a size of 20 nm in terms of sphere equivalent volume diameter (SEVD). Incidentally, sphere equivalent volume diameter SEVD can be calculated according to the equation: $SEVD = 2(3S/4\pi H)^{1/3}$ when defining (S) to be the area of the defect when viewed overhead and defining (h) to be the defect height (to apply similarly in the subsequent examples and comparative examples). Defect area (S) and defect height (h) can be measured with an atomic force microscope (AFM). As a result, the number of detected defects, including pseudo defects, was 10,520, representing a considerable reduction in the number of detected defects in comparison with the more than 100,000 defects conventionally detected. A number of detected defects of this degree enable the presence of contaminants, scratches or other critical defects to be easily detected.

In addition, a 132 mm×132 mm region on a main surface of the mask blank substrate was inspected for defects in the same manner as described above, using a highly sensitive defect inspection apparatus having an inspection light source wavelength of 266 nm (MAGICS M7360 manufactured by Lasertec Corp.). Inspection sensitivity conditions were set to the most sensitive inspection sensitivity conditions. As a result, the number of detected defects, including pseudo defects, totaled 15, representing a considerable reduction in the number of detected defects in comparison with the 100,000 defects conventionally detected.

<Fabrication of Substrate with Multilayer Reflective Film>

A substrate with a multilayer reflective film was manufactured by forming a multilayer reflective film, obtained by alternately laminating a high refractive index layer and a low refractive index layer by ion beam sputtering, on a main surface of the mask blank substrate obtained as previously described, followed by forming a protective film on this multilayer reflective film.

The multilayer reflective film was obtained by depositing 40 pairs of an Si film having a film thickness of 4.2 nm (high refractive index layer) and an Mo film having a film thickness of 2.8 nm (low refractive index layer) that constituted a single pair (Thickness totaled 280 nm). Moreover, the protective film was composed of Ru and had a film thickness of 2.5 nm. Furthermore, the multilayer reflective film was deposited by ion beam sputtering such that the incident angle of sputtered particles of the Si film and sputtered particles of the Mo film was 30 degrees relative to the normal of the substrate main surface.

The surface status of the protective film was analyzed by power spectral analysis by measuring with the NewView 6300 White-Light Interferometer Non-Contact Surface Morphology Analyzer manufactured by Zygo Corp. (measured region: 0.14 mm×0.1 mm, no. of pixels: 640×480).

As a result of power spectral analysis, the power spectral density at a spatial frequency of $1 \times 10^{-2}$ μm$^{-1}$ to 1 μm$^{-1}$ was $1.28 \times 10^7$ nm$^4$ at its maximum point (spatial frequency: $1 \times 10^{-2}$ μm$^{-1}$).

In addition, as a result of carrying out power spectral analysis by measuring with an atomic force microscope (measured region: 1 μm×1 μm), the power spectral density at a spatial frequency of 1 μm$^{-1}$ to 100 μm$^{-1}$ was 15.8 nm$^4$ at its maximum point (spatial frequency: 5 μm$^{-1}$). More specifically, power spectral density at a spatial frequency of 1 μm$^{-1}$ to 10 μm$^{-1}$ was 15.8 nm$^4$ at its maximum point (spatial frequency: 5 μm$^{-1}$), and power spectral density at a spatial frequency of 10 μm$^{-1}$ to 100 μm$^{-1}$ was 6.73 nm$^4$ at its maximum point (spatial frequency: 10 μm$^{-1}$). In addition, Rms of the protective film surface was 0.126 nm. In addition, measurement of the reflectance of this protective film surface with the Model LPR1016 manufactured by EUV Technology Corp. yielded high reflectance of 65.1%.

According to the above results, by setting PSD of a main surface of a mask blank substrate within the range defined in the present invention, power spectral density at a spatial frequency of 1 μm$^{-1}$ to 100 μm$^{-1}$ of a protective film formed thereabove was also confirmed to be able to be reduced to a low value similar to the surface of the main surface of the mask blank substrate.

A 132 mm×132 mm region on the surface of the protective film of the substrate with a multilayer reflective film of Example 1 was inspected for defects using a highly sensitive defect inspection apparatus having an inspection light source wavelength of 193 nm (Teron 600 Series manufactured by KLA-Tencor Corp.). As a result, the number of detected defects, including pseudo defects, totaled 21,705, representing a considerable reduction in the number of pseudo defects in comparison with the more than 100,000 defects conventionally detected.

In addition, a 132 mm×132 mm region on the surface of the protective film of the substrate with a multilayer reflective film was inspected for defects in the same manner as described above, using a highly sensitive defect inspection apparatus having an inspection light source wavelength of 266 nm (MAGICS M7360 manufactured by Lasertec Corp.). Inspection sensitivity conditions were set to the most sensitive inspection sensitivity conditions. As a result, the number of detected defects, including pseudo defects, totaled 24.

Moreover, as a result of inspecting a 132 mm×132 mm region on the surface of the protective film of the substrate with a multilayer reflective film of Example 1 for defects using a highly sensitive defect inspection apparatus having an inspection light source wavelength of 13.5 nm, the number of detected defects, including pseudo defects, was low and defects were easily inspected.

In addition, when the surface of the substrate with a multilayer reflective film was irradiated with EUV light (wavelength: 13.5 nm), there was no scattering (speckling) of EUV light observed that impairs defect inspection apparatuses capable of detecting defects having a size of 15 nm in terms of SEVD. Thus, in a highly sensitive defect inspection apparatus having an inspection light source wavelength of 13.5 nm capable of detecting defects having a size of 15 nm in terms of SEVD, since scattering of EUV light from the multilayer reflective film and protective film is inhibited and noise attributable to speckling can be reduced, defect inspections can be reliably carried out on substrates with a multilayer reflective film.

Furthermore, as was previously described, since the PSD value at a spatial frequency of $1 \times 10^{-2}$ μm$^{-1}$ to 1 μm$^{-1}$ of the protective film surface is $1.28 \times 10^7$ nm$^4$, which is not more than $4 \times 10^7$ nm$^4$, and undulation (local sloping) at a spatial wavelength of 2 μm to 1 mm is 70 μrad, which is not more than 200 μrad, decreases in pattern contrast attributable to flare during pattern transfer can also be prevented.

Furthermore, fiduciary marks for coordinate management of the locations of the aforementioned defects were formed with a focused ion beam on the protective film and multilayer reflective film of the substrate with a multilayer reflective film of Example 1 at four locations outside the region of transfer pattern formation (142 mm×142 mm).

<Fabrication of Reflective Mask Blank for EUV Exposure>

A back side electrically conductive film was formed by DC magnetron sputtering on the back side of the aforementioned substrate with a multilayer reflective film on which a multilayer reflective film was not formed. The back side electrically conductive film was formed by positioning a Cr target in opposition to the back surface of the substrate with a multilayer reflective film and carrying out reactive sputtering in an atmosphere of a mixture of Ar and N$_2$ gas (Ar:N$_2$=90%:10%). Measurement of the elementary composition of the back side electrically conductive film by Rutherford back scattering analysis yielded values of 90 at % for Cr and 10 at % for N. In addition, the film thickness of the back side electrically conductive film was 20 nm.

Moreover, an absorber film composed of TaBN film was deposited on the protective film surface of the aforementioned substrate with a multilayer reflective film by DC magnetron sputtering to fabricate a reflective mask blank. This absorber film was formed by positioning a TaB target (Ta:B=80:20) in opposition to the absorber film of the substrate with a multilayer reflective film and carrying out reactive sputtering in an atmosphere of a mixture of Xe and N$_2$ gas (Xe:N$_2$=90%:10%).

Measurement of the elementary composition of the absorber film by Rutherford back scattering analysis yielded a value of 80 at % for Ta, 10 at % for B and 10 at % for N. In addition, film thickness of the absorber film was 65 nm. Furthermore, the crystal structure of the absorber film was determined to be an amorphous structure when measured with an X-ray diffraction analyzer (XRD).

<Fabrication of Reflective Mask>

A resist was coated onto the surface of the aforementioned absorber film by spin coating followed by going through heating and cooling steps to fabricate a resist film having a film thickness of 150 nm. Next, a resist pattern was formed by going through drawing step of a desired pattern and development step.

The absorber film in the form of a TaBN film was then patterned by using this resist pattern as a mask and dry etching with a mixture of $Cl_2$ and He gas to form an absorber pattern on the protective film. Subsequently, the resist film was removed followed by chemical cleaning in the same manner as previously described to fabricate a reflective mask.

Furthermore, in the aforementioned drawing step, the reflective mask was fabricated by correcting drawing data based on defect data generated on the basis of the aforementioned fiducial marks formed at four locations outside the transfer pattern formation region so that the absorber pattern was arranged at those locations where critical defects were present based on the defect data and transferred pattern (circuit pattern). The resulting reflective mask was confirmed to be free of defects when inspected for defects using a highly sensitive defect inspection apparatus (Teron 600 Series manufactured by KLA-Tencor Corp.).

A summary of the results of power spectral analyses carried out in each manufacturing step of the aforementioned mask blank substrate and substrate with a multilayer reflective film are as shown in the following Table 1.

[Table 1]

TABLE 1

| | | PSD ($nm^4$) | | | |
|---|---|---|---|---|---|
| | | After MRF and before EEM | After EEM and before CARE | After CARE and before ML deposition | After ML*3/Ru deposition |
| MSFR*1 | Max | $4.5 \times 10^6$ | $1 \times 10^6$ | $5 \times 10^5$ | $1.28 \times 10^7$ |
| HSFR*2 | Max | 14 | 25 | 5 | 15.8 |
| | | 14/8.32 | 25/9 | 5/1.9 | 15.8/6.73 |

*1Spatial frequency: $1 \times 10^{-2}$ $\mu m^{-1}$ to 1 $\mu m^{-1}$
*2Spatial frequency: 1 $\mu m^{-1}$ to 100 $\mu m^{-1}$ Left/right: PSD at 1 $\mu m^{-1}$ to 10 $\mu m^{-1}$/PSD at 10 $\mu m^{-1}$ to 100 $\mu m^{-1}$
*3ML: Multilayer reflective film As previously described, since the reflective mask was confirmed to be free of defects when inspected with a highly sensitive defect inspection apparatus, in the case of carrying out a lithography process using this reflective mask and exposure light wavelength, a semiconductor device can be fabricated without the occurrence of transfer pattern defects attributable to the reflective mask.

Comparative Example 1

A mask blank substrate and a substrate with a multilayer reflective film were fabricated in the same manner as Example 1 with the exception of not carrying out EEM and CARE surface processing following surface processing by MRF in Example 1 and carrying out double-sided touch polishing instead.

A summary of the results of power spectral analyses carried out in each manufacturing step of the aforementioned mask blank substrate and substrate with a multilayer reflective film, and the results of defect inspections using a highly sensitive defect inspection apparatus are as shown in the following Table 2. Furthermore, the results of measuring power spectral density of the mask blank substrate following MRF-double-sided touch polishing are shown in FIG. 8 ("Unprocessed").

[Table 2]

TABLE 2

| | | PSD ($nm^4$) | |
|---|---|---|---|
| | | After MRF-double-sided polishing and before ML deposition | After ML*3/Ru deposition |
| MSFR*1 | Max | $3.7 \times 10^7$ | $6.1 \times 10^7$ |
| HSFR*2 | Max | 15.8/5 | 16.6/7.5 |
| Teron 600 Series | Detected defects (number) | >100,000 | 22,803 |
| MAGICS M7360 | Detected defects (number) | 46 | 58 |

*1Spatial frequency: $1 \times 10^{-2}$ $\mu m^{-1}$ to 1 $\mu m^{-1}$
*2Spatial frequency: 1 $\mu m^{-1}$ to 100 $\mu m^{-1}$ Left/right: PSD at 1 $\mu m^{-1}$ to 10 $\mu m^{-1}$/PSD at 10 $\mu m^{-1}$ to 100 $\mu m^{-1}$
*3ML: Multilayer reflective film As shown in Table 2 above, as a result of carrying out a defect inspection on the mask blank substrate using a highly sensitive defect inspection apparatus having an inspection light source wavelength of 193 nm (Teron 600 Series manufactured by KLA-Tencor Corp.), the number of detected defects, including pseudo defects, part way through the defect inspection exceeded 100,000, and the defect inspection was unable to be carried out in a 132 mm×132 mm region. In an ordinary reflective mask manufacturing process, the mask blank substrate would be judged to be unacceptable and, for example, returned to the polishing step, thereby leading to an increase in manufacturing costs. In addition, 46 defects were detected as a result of inspecting for defects using a highly sensitive defect inspection apparatus having an inspection light source wavelength of 266 nm (MAGICS M7360 manufactured by Lasertec Corp.).

In addition, as a result of carrying out a defect inspection on the substrate with a multilayer reflective film using a highly sensitive defect inspection apparatus having an inspection light source wavelength of 193 nm (Teron 600 Series manufactured by KLA-Tencor Corp.), the number of detected defects, including pseudo defects, was 22,803, constituting an increase in comparison with Example 1. In addition, as a result of inspecting defects using a highly sensitive defect inspection apparatus having an inspection light source wavelength of 266 nm (MAGICS M7360 manufactured by Lasertec Corp.), the number of detected defects was 58.

Moreover, as a result of inspecting for defects in a 132 mm×132 mm region on the surface of a protective film of the substrate with a multilayer reflective film of Comparative Example 1 using a highly sensitive defect inspection apparatus having an inspection light source wavelength of 13.5 nm, the number of detected defects, including pseudo defects, exceeded 100,000, and the defect inspection was unable to be carried out in the 132 mm×132 mm region.

In addition, when the surface of the substrate with a multilayer reflective film was irradiated with EUV light (wavelength: 13.5 nm), scattering (speckling) of EUV light, which impairs defect inspection apparatuses capable of detecting defects having a size of 15 nm in terms of SEVD was prominently observed. Thus, in a highly sensitive defect inspection apparatus having an inspection light source wavelength of 13.5 nm capable of detecting defects having a size of 15 nm in terms of SEVD, scattering of EUV light from the multilayer reflective film and protective film cannot be ignored and defect inspections cannot be carried out on substrates with a multilayer reflective film.

Example 2

A mask blank substrate and a substrate with a multilayer reflective film were fabricated in the same manner as Example 1 with the exception of carrying out double-sided touch polishing using a polishing solution containing alkaline colloidal silica polishing abrasive particles (average diameter: about 80 nm) after carrying out magnetorheological finishing and cleaning but before carrying out surface processing by EEM in the aforementioned Example 1.

A summary of the results of power spectral analyses carried out in each manufacturing step of the aforementioned mask blank substrate and substrate with a multilayer reflective film, and the results of defect inspections using a highly sensitive defect inspection apparatus, are as shown in the following Table 3.

[Table 3]

TABLE 3

| | | After CARE and before ML deposition | After ML*[3]/Ru deposition |
|---|---|---|---|
| Surface roughness Rms | nm | 0.04 | 0.122 |
| MSFR*[1] | Max | $1.6 \times 10^5$ | $4.7 \times 10^6$ |
| HSFR*[2] | Max | 4.6 | 14.8 |
| | | 4.6/1.21 | 14.8/6.48 |
| Teron 600 Series | Detected defects (number) | 6428 | 11754 |
| MAGICS M7360 | Detected defects (number) | 13 | 20 |

*[1]Spatial frequency: $1 \times 10^{-2}$ μm$^{-1}$ to 1 μm$^{-1}$
*[2]Spatial frequency: 1 μm$^{-1}$ to 100 μm$^{-1}$ Left/right: PSD at 1 μm$^{-1}$ to 10 μm$^{-1}$/PSD at 10 μm$^{-1}$ to 100 μm$^{-1}$
*[3]ML: Multilayer reflective film Furthermore, measurement of the reflectance of the protective film surface of the aforementioned substrate with a multilayer reflective film with the Model LPR1016 manufactured by EUV Technology Corp. yielded high reflectance of 65.2%.

As shown in Table 3 above, as a result of carrying out a defect inspection on the mask blank substrate using a highly sensitive defect inspection apparatus having an inspection light source wavelength of 193 nm (Teron 600 Series manufactured by KLA-Tencor Corp.), the number of detected defects, including pseudo defects, was 6,428, which constitutes a considerable reduction in the number of detected defects in comparison with Example 1. In addition, as a result of carrying out a defect inspection using a highly sensitive defect inspection apparatus having an inspection light source wavelength of 266 nm (MAGICS M7360 manufactured by Lasertec Corp.), the number of detected defects was 13, indicating a slight decrease in comparison with the number of defects detected in Example 1.

In addition, as a result of carrying out a defect inspection on the substrate with a multilayer reflective film using a highly sensitive defect inspection apparatus having an inspection light source wavelength of 193 nm (Teron 600 Series manufactured by KLA-Tencor Corp.), the number of detected defects, including pseudo defects, was 11,754, which constitutes a considerable reduction in the number of detected defects in comparison with Example 1. In addition, as a result of carrying out a defect inspection using a highly sensitive defect inspection apparatus having an inspection light source wavelength of 266 nm (MAGICS M7360 manufactured by Lasertec Corp.), the number of detected defects was 20, indicating a slight decrease in comparison with Example 1.

Moreover, as a result of inspecting for defects in a 132 mm×132 mm region on the surface of a protective film of the substrate with a multilayer reflective film of Example 2 using a highly sensitive defect inspection apparatus having an inspection light source wavelength of 13.5 nm, the number of detected defects, including pseudo defects, was low and defects were easily inspected.

In addition, when the surface of the substrate with a multilayer reflective film was irradiated with EUV light (wavelength: 13.5 nm), there was no scattering (speckling) of EUV light observed that impairs defect inspection apparatuses capable of detecting defects having a size of 15 nm in terms of SEVD. Thus, in a highly sensitive defect inspection apparatus having an inspection light source wavelength of 13.5 nm capable of detecting defects having a size of 15 nm in terms of SEVD, since scattering of EUV light from the protective film surface is inhibited, defect inspections can be reliably carried out on substrates with a multilayer reflective film.

Example 3

A mask blank substrate and a substrate with a multilayer reflective film were fabricated in the same manner as Example 1 with the exception of changing the CARE catalyst to SUS and changing cleaning with aqua regia to cleaning with sulfuric acid (temperature: about 65° C.).

A summary of the results of power spectral analyses carried out in each manufacturing step of the aforementioned mask blank substrate and substrate with a multilayer reflective film, and the results of defect inspections using a highly sensitive defect inspection apparatus, are as shown in the following Table 4.

[Table 4]

TABLE 4

| | | After CARE and before ML deposition | After ML*[3]/Ru deposition |
|---|---|---|---|
| Surface roughness Rms | nm | 0.08 | 0.129 |
| MSFR*[1] | Max | $1.3 \times 10^6$ | $2.8 \times 10^7$ |
| HSFR*[2] | Max | 7.6 | 16.2 |
| | | 7.6/3.43 | 16.2/7.31 |
| Teron 600 Series | Detected defects (number) | 20755 | 22010 |
| MAGICS M7360 | Detected defects (number) | 18 | 27 |

*[1]Spatial frequency: $1 \times 10^{-2}$ μm$^{-1}$ to 1 μm$^{-1}$
*[2]Spatial frequency: 1 μm$^{-1}$ to 100 μm$^{-1}$ Left/right: PSD at 1 μm$^{-1}$ to 10 μm$^{-1}$/PSD at 10 μm$^{-1}$ to 100 μm$^{-1}$
*[3]ML: Multilayer reflective film Furthermore, measurement of the reflectance of the protective film surface with the Model LPR1016 manufactured by EUV Technology Corp. yielded high reflectance of 65.0%.

As shown in Table 4 above, as a result of carrying out a defect inspection on the mask blank substrate using a highly sensitive defect inspection apparatus having an inspection light source wavelength of 193 nm (Teron 600 Series manufactured by KLA-Tencor Corp.), the number of detected defects, including pseudo defects, was 20,755, and although this constitutes an increase in the number of detected defects in comparison with Example 1, this number did not exceed 100,000 and defects in a 132 mm×132 mm region were able to be detected. As a result of carrying out a defect inspection using a highly sensitive defect inspection apparatus having an inspection light source wavelength of 266 nm (MAGICS M7360 manufactured by Lasertec Corp.), the number of detected defects was 18, indicating a slight increase in comparison with the number of detected defects in Example 1.

In addition, as a result of carrying out a defect inspection on the substrate with a multilayer reflective film using a highly sensitive defect inspection apparatus having an inspection light source wavelength of 193 nm (Teron 600 Series manufactured by KLA-Tencor Corp.), the number of detected defects, including pseudo defects, was 22,010, and although this constitutes an increase in the number of detected defects in comparison with Example 1, this number did not exceed 100,000 and defects in a 132 mm×132 mm region were able to be detected. As a result of carrying out a defect inspection using a highly sensitive defect inspection apparatus having an inspection light source wavelength of 266 nm (MAGICS M7360 manufactured by Lasertec Corp.), the number of detected defects was 27, also indicating a slight increase in comparison with Example 1.

Moreover, as a result of inspecting for defects in a 132 mm×132 mm region on the surface of a protective film of the substrate with a multilayer reflective film of Example 3 using a highly sensitive defect inspection apparatus having an inspection light source wavelength of 13.5 nm, the number of defects, including pseudo defects, was low and defects were easily inspected.

In addition, when the surface of the substrate with a multilayer reflective film was irradiated with EUV light (wavelength: 13.5 nm), there was no scattering (speckling) of EUV light observed that impairs defect inspection apparatuses capable of detecting defects having a size of 15 nm in terms of SEVD. Thus, in a highly sensitive defect inspection apparatus having an inspection light source wavelength of 13.5 nm capable of detecting defects having a size of 15 nm in terms of SEVD, since scattering of EUV light from the protective film surface is inhibited, defect inspections can be reliably carried out on substrates with a multilayer reflective film.

BRIEF DESCRIPTION OF THE REFERENCE SYMBOLS

10 Mask blank substrate
20 Substrate with a multilayer reflective film
21 Multilayer reflective film
22 Protective film
23 Back side electrically conductive film
24 Absorber film
27 Absorber pattern
30 Reflective mask blank
40 Reflective mask
100 CARE (catalyst-referred etching) processing apparatus
124 Treatment tank
126 Catalyst surface plate
128 Glass substrate (processing target)
130 Substrate holder
132 Rotating shaft
140 Base
142 Platinum (catalyst)
170 Heater
172 Heat exchanger
174 Treatment liquid supply nozzle
176 Liquid fluid path

The invention claimed is:

1. A mask blank substrate that is used in lithography, wherein
the power spectral density at a spatial frequency of $1\times10^{-2}$ $\mu m^{-1}$ to 1 $\mu m^{-1}$, obtained by measuring a 0.14 mm×0.1 mm region on a main surface of the mask blank substrate on the side of which a transfer pattern is formed at 640×480 pixels with a white-light interferometer, is not more than $4\times10^6$ nm$^4$, and the power spectral density at a spatial frequency of not less than 1 $\mu m^{-1}$, obtained by measuring a 1 $\mu m\times 1$ $\mu m$ region on the main surface with an atomic force microscope, is not more than 10 nm$^4$.

2. The mask blank substrate according to claim 1, wherein the root mean square roughness (Rms) obtained by measuring a 1 $\mu m\times 1$ $\mu m$ region of the main surface with an atomic force microscope is less than 0.13 nm.

3. The mask blank substrate according to claim 1, wherein the power spectral density at a spatial frequency of 1 $\mu m^{-1}$ to 10 $\mu m^{-1}$ obtained by measuring a 1 $\mu m\times 1$ $\mu m$ region on the main surface with an atomic force microscope is 1 nm$^4$ to 10 nm$^4$.

4. The mask blank substrate according to claim 1, wherein the substrate is a mask blank substrate used in EUV lithography.

5. A substrate with a multilayer reflective film, comprising: a multilayer reflective film, in which a high refractive index layer and a low refractive index layer are alternately laminated, on the main surface of the mask blank substrate according to claim 1.

6. The substrate with a multilayer reflective film according to claim 5, further comprising: a protective film on the multilayer reflective film.

7. A reflective mask blank, comprising: an absorber film to serve as a transfer pattern on the protective film of the substrate with a multilayer reflective film according to claim 6.

8. A reflective mask having an absorber pattern, obtained by patterning the absorber film in the reflective mask blank according to claim 7, on the protective film.

9. A reflective mask blank, comprising: an absorber film to serve as a transfer pattern on the multilayer reflective film of the substrate with a multilayer reflective film according to claim 5.

10. A reflective mask having an absorber pattern, obtained by patterning the absorber film in the reflective mask blank according to claim 9, on the multilayer reflective film.

11. A method of manufacturing a semiconductor device, comprising: forming a transfer pattern on a workpiece by carrying out a lithography process that uses an exposure apparatus using the reflective mask according to claim 10.

12. A method of manufacturing a substrate with a multilayer reflective film, comprising: forming a multilayer reflective film, in which a high refractive index layer and a low refractive index layer are alternately laminated, on the main surface of the mask blank substrate according to claim 1.

13. The method of manufacturing a substrate with a multilayer reflective film according to claim 12, wherein the multilayer reflective film is formed by alternately depositing the high refractive index layer and the low refractive index layer by ion beam sputtering.

14. The method of manufacturing a substrate with a multilayer reflective film according to claim 13, wherein the multilayer reflective film is formed by making sputtered particles of a high refractive index material and a low refractive index material enter alternately at an incident angle of 0 degree to 30 degrees relative to the normal of the main surface by ion beam sputtering using a target of a high refractive index material and a low refractive index material.

15. The method of manufacturing a substrate with a multilayer reflective film according to claim 12, further comprising: forming a protective film on the multilayer reflective film.

16. A substrate with a multilayer reflective film, having a multilayer reflective film, in which a high refractive index layer and a low refractive index layer are alternately laminated, on a main surface of a mask blank substrate used in lithography, wherein the power spectral density at a spatial frequency of $1\times10^{-2}$ $\mu m^{-1}$ to 1 $\mu m^{-1}$, obtained by measuring a 0.14 mm×0.1 mm region on a surface of the substrate with a multilayer reflective film on the side of which the multilayer reflective film is formed at 640×480 pixels with a white-light interferometer, is not more than $4\times10^7$ $nm^4$, and the power spectral density at a spatial frequency of 1 $\mu m^{-1}$ to 100 $\mu m^{-1}$, obtained by measuring a 1 $\mu m\times 1$ $\mu m$ region on the surface of the substrate with a multilayer reflective film with an atomic force microscope, is not more than 20 $nm^4$.

17. The substrate with a multilayer reflective film according to claim 16, wherein the root mean square roughness (Rms) obtained by measuring a 1 $\mu m\times 1$ $\mu m$ region of the surface of the substrate with a multilayer reflective film with an atomic force microscope is less than 0.13 nm.

18. The substrate with a multilayer reflective film according to claim 16, further comprising: a protective film on the multilayer reflective film.

19. A method of manufacturing a mask blank substrate, comprising a step of:

conducting a surface processing for processing a main surface of a mask blank substrate used in lithography on the side of which a transfer pattern is formed so as to obtain a prescribed surface morphology; wherein, the surface processing is conducted such that the power spectral density at a spatial frequency of $1\times10^{-2}$ $\mu m^{-1}$ to 1 $\mu m^{-1}$, obtained by measuring a 0.14 mm×0.1 mm region on the main surface at 640×480 pixels with a white-light interferometer, is not more than $4\times10^6$ $nm^4$, and the power spectral density at a spatial frequency of not less than 1 $\mu m^{-1}$, obtained by measuring a 1 $\mu m\times 1$ $\mu m$ region on the main surface with an atomic force microscope, is not more than 10 $nm^4$.

20. The method of manufacturing a mask blank substrate according to claim 19, wherein the surface processing is conducted by carrying out an intermediate spatial frequency region roughness-reducing such that the power spectral density at a spatial frequency of $1\times10^{-2}$ $\mu m^{-1}$ to 1 $\mu m^{-1}$, obtained by measuring a 0.14 mm×0.1 mm region on the main surface at 640×480 pixels with a white-light interferometer, is not more than $4\times10^6$ $nm^4$, and a high spatial frequency region roughness-reducing such that the power spectral density at a spatial frequency of not less than 1 obtained by measuring a 1 $\mu m\times 1$ $\mu m$ region on the main surface with an atomic force microscope, is not more than 10 $nm^4$.

21. The method of manufacturing a mask blank substrate according to claim 20, wherein the high spatial frequency region roughness-reducing is carried out after the intermediate spatial frequency region roughness-reducing.

22. The method of manufacturing a mask blank substrate according to claim 20, wherein the intermediate spatial frequency region roughness-reducing is carried out by processing the main surface by EEM.

23. The method of manufacturing a mask blank substrate according to claim 20, wherein the high spatial frequency region roughness-reducing is carried out by processing the main surface by catalyst-referred etching.

24. The method of manufacturing a mask blank substrate according to claim 19, wherein the surface processing is carried out by elastic emission machining (EEM) and/or catalyst-referred etching (CARE).

25. The method of manufacturing a mask blank substrate according to claim 19, wherein the substrate is a mask blank substrate used in EUV lithography.

26. A method of manufacturing a substrate with a multilayer reflective film, comprising: forming a multilayer reflective film, in which a high refractive index layer and a low refractive index layer are alternately laminated, on the main surface of the mask blank substrate manufactured by the manufacturing method according to claim 19.

* * * * *